United States Patent
Chu et al.

(10) Patent No.: US 9,981,841 B2
(45) Date of Patent: May 29, 2018

(54) MEMS INTEGRATED PRESSURE SENSOR AND MICROPHONE DEVICES AND METHODS OF FORMING SAME

(71) Applicant: Taiwan Semiconductor Manufacturing Company, Ltd., Hsinchu (TW)

(72) Inventors: Chia-Hua Chu, Zhubei (TW); Chun-Wen Cheng, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days. days.

(21) Appl. No.: 15/595,711

(22) Filed: May 15, 2017

(65) Prior Publication Data

US 2017/0247251 A1    Aug. 31, 2017

Related U.S. Application Data

(60) Continuation of application No. 14/934,854, filed on Nov. 6, 2015, now Pat. No. 9,650,239, which is a (Continued)

(51) Int. Cl.
*B81B 7/02* (2006.01)
*B81C 1/00* (2006.01)

(52) U.S. Cl.
CPC ............ *B81B 7/02* (2013.01); *B81C 1/00309* (2013.01); *B81B 2201/0257* (2013.01);
(Continued)

(58) Field of Classification Search
CPC ............. B81B 7/02; B81B 2203/0127; B81B 2201/0242; B81B 2201/0235;
(Continued)

(56) References Cited

U.S. PATENT DOCUMENTS 8,350,346 B1 * 1/2013 Huang ...................... B81B 7/02
257/415
8,513,747 B1 8/2013 Huang et al.
(Continued)

FOREIGN PATENT DOCUMENTS

TW         201242382      10/2012
WO         2012122872      9/2012
WO    WO 2012122872 A1 *  9/2012   ........... H04R 19/005

*Primary Examiner* — Fernando L Toledo
*Assistant Examiner* — Adam S Bowen
(74) *Attorney, Agent, or Firm* — Slater Matsil, LLP

(57) ABSTRACT

A micro-electromechanical systems (MEMS) device includes a MEMS substrate having a first opening, a second opening, and a membrane layer comprising a first membrane disposed over the first opening and a second membrane disposed over the second opening. The MEMS device also includes a carrier substrate bonded to a first side of the MEMS substrate, the carrier substrate having a first cavity exposing the first membrane and a second cavity exposing the second membrane, and a cap substrate bonded to a second side of the MEMS substrate. The cap substrate has a third cavity connected to the first opening and a fourth cavity connected to the second opening. The first membrane, the first cavity, and the third cavity are part of a pressure sensor. The fourth cavity extends completely through the cap substrate. The second membrane, the second cavity, and the fourth cavity are part of a microphone.

20 Claims, 30 Drawing Sheets

Related U.S. Application Data division of application No. 13/944,382, filed on Jul. 17, 2013, now Pat. No. 9,187,317.

(60) Provisional application No. 61/783,401, filed on Mar. 14, 2013.

(52) U.S. Cl.
CPC ............. *B81B 2201/0264* (2013.01); *B81B 2203/0127* (2013.01); *B81C 2203/0118* (2013.01)

(58) Field of Classification Search
CPC .... B81B 2201/0264; B81B 2201/0257; B81C 1/00309; B81C 2203/0118; H01L 21/78
USPC ........................................................ 257/419
See application file for complete search history.

(56) References Cited

U.S. PATENT DOCUMENTS

| | | | |
|---|---|---|---|
| 8,890,191 B2 | 11/2014 | Shiu et al. | |
| 9,260,295 B2 | 2/2016 | Chu et al. | |
| 2005/0037534 A1* | 2/2005 | Sawyer | B81B 7/0048 438/84 |
| 2005/0176179 A1* | 8/2005 | Ikushima | H01L 37/00 438/125 |
| 2006/0016486 A1 | 1/2006 | Teach et al. | |
| 2007/0099395 A1 | 5/2007 | Sridhar et al. | |
| 2007/0231943 A1 | 10/2007 | Duellet et al. | |
| 2008/0192963 A1 | 8/2008 | Sato | |
| 2011/0121412 A1 | 5/2011 | Quevy et al. | |
| 2012/0038372 A1 | 2/2012 | Reinmuth et al. | |
| 2012/0043627 A1* | 2/2012 | Lin | G01P 15/0802 257/415 |
| 2012/0098074 A1 | 4/2012 | Lin et al. | |
| 2012/0261744 A1 | 10/2012 | Wang et al. | |
| 2012/0261774 A1 | 10/2012 | Graham et al. | |
| 2012/0280594 A1 | 11/2012 | Chen et al. | |
| 2012/0326248 A1 | 12/2012 | Daneman et al. | |
| 2013/0108074 A1 | 5/2013 | Reining | |
| 2013/0214370 A1 | 8/2013 | Hussain et al. | |
| 2013/0283912 A1 | 10/2013 | Lin | |
| 2013/0334620 A1 | 12/2013 | Chu et al. | |
| 2014/0042562 A1 | 2/2014 | Chu et al. | |
| 2014/0239353 A1 | 8/2014 | Daneman et al. | |
| 2014/0264648 A1 | 9/2014 | Chu et al. | |
| 2014/0264653 A1 | 9/2014 | Cheng et al. | |
| 2014/0264661 A1 | 9/2014 | Cheng et al. | |
| 2014/0264662 A1 | 9/2014 | Cheng et al. | |
| 2014/0319631 A1 | 10/2014 | Chu | |

* cited by examiner

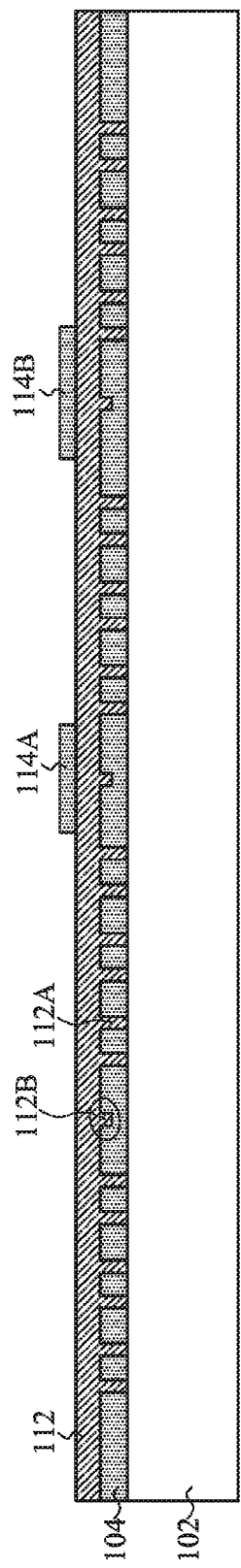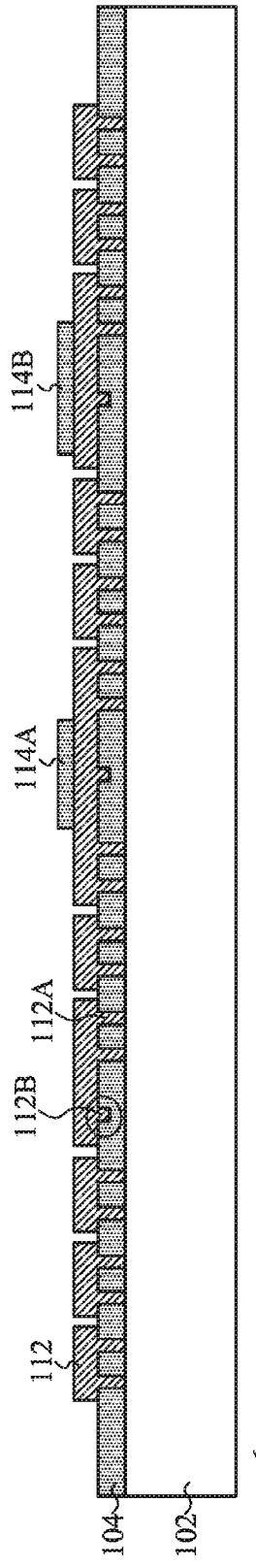

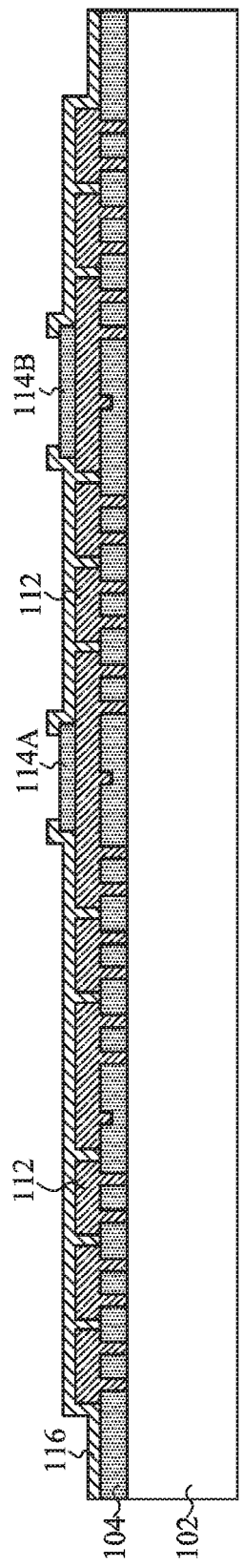
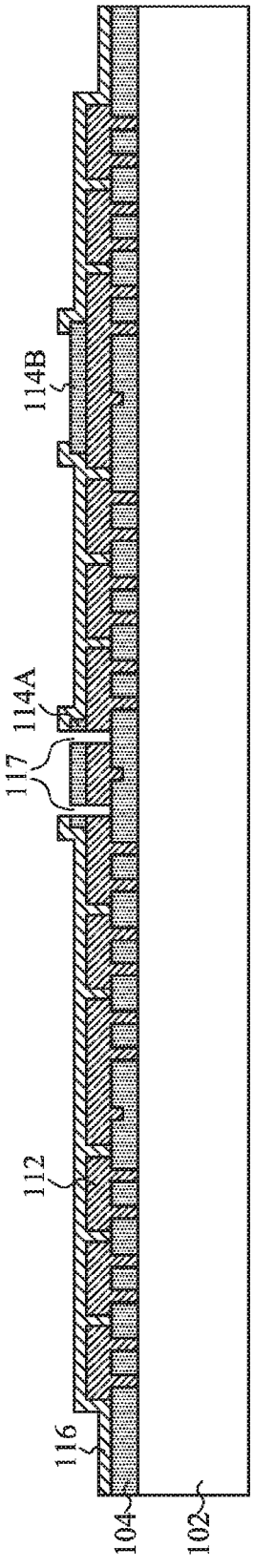
Fig. 1F
Fig. 1G

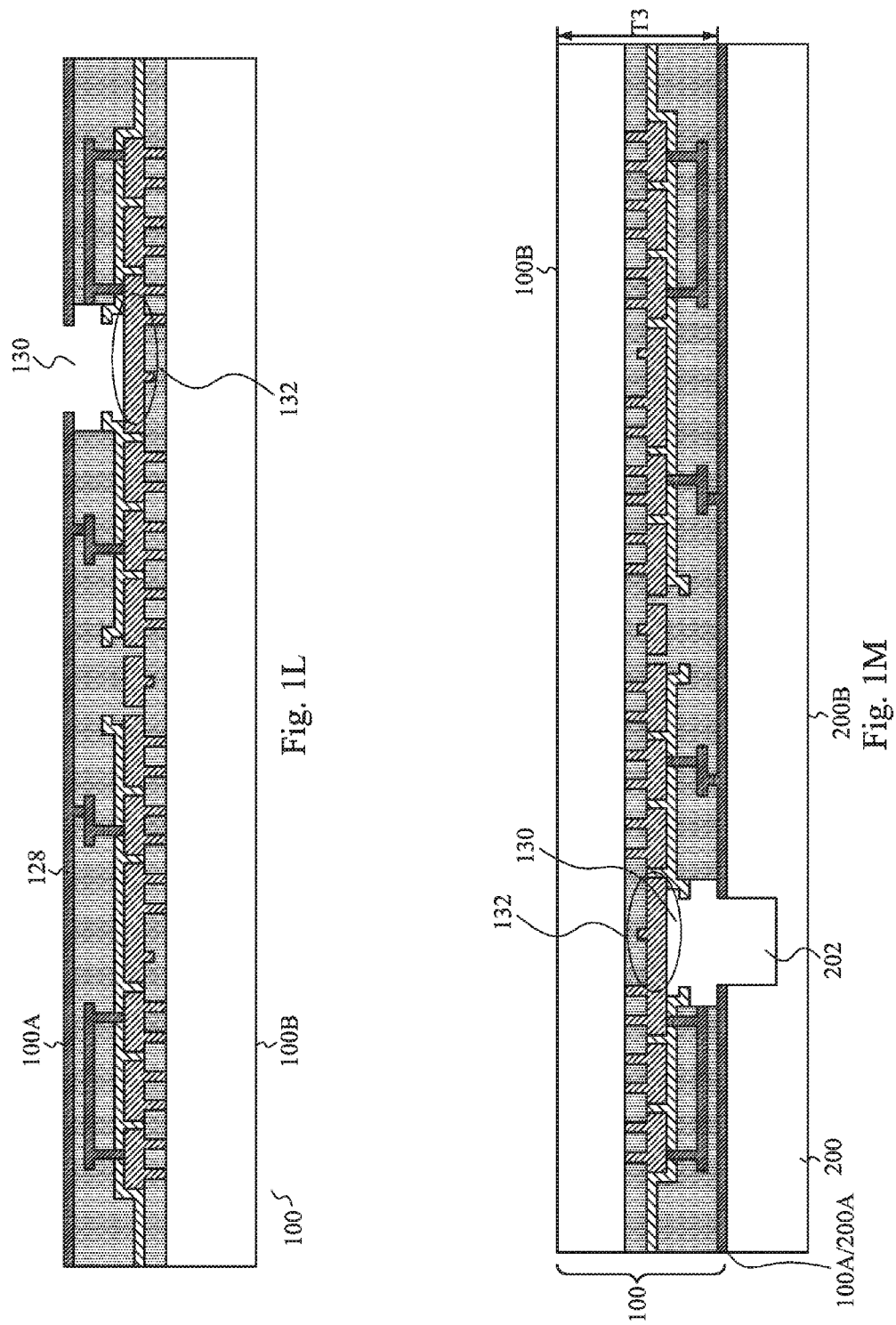

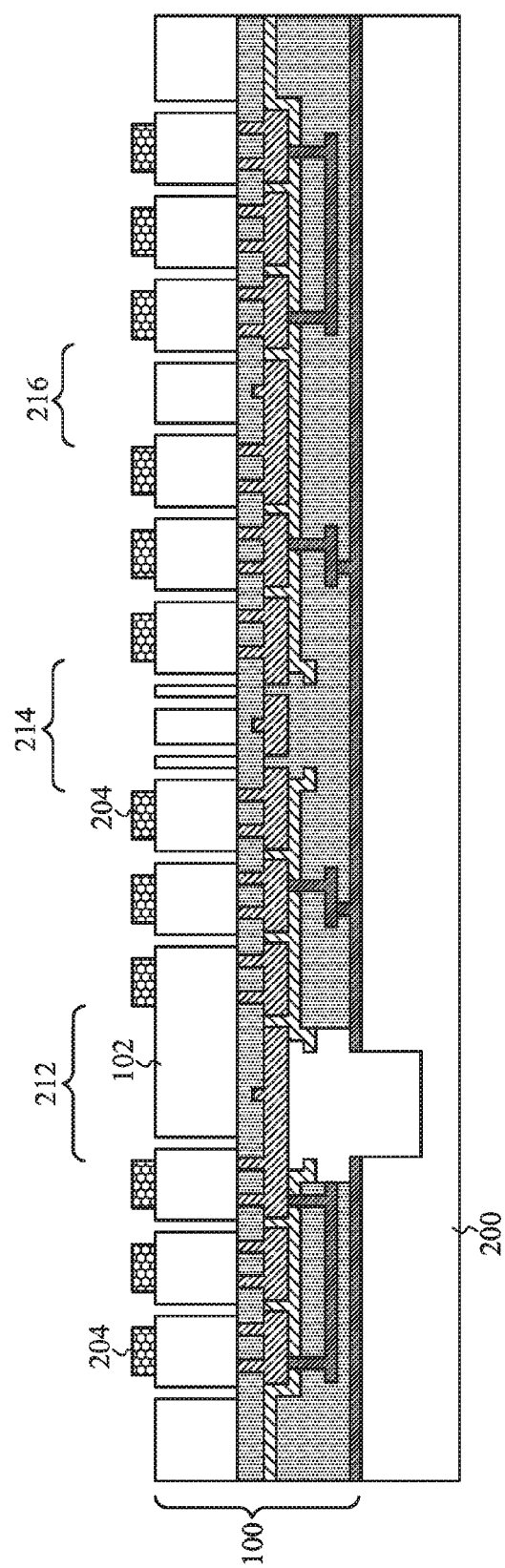

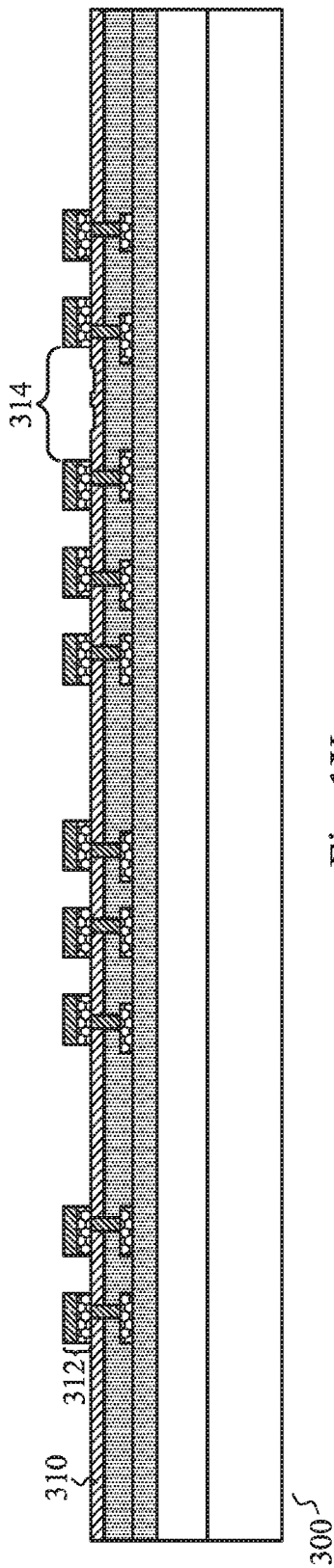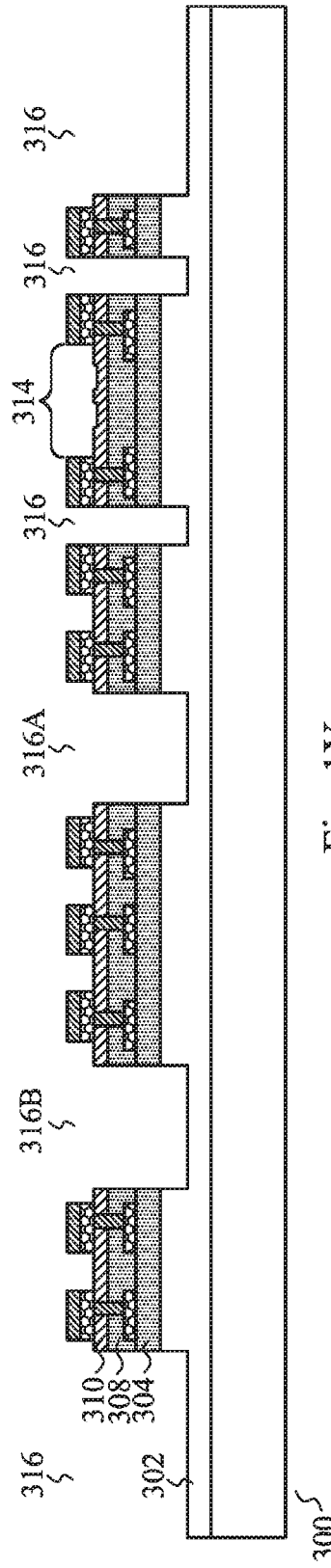
Fig. 1X
Fig. 1Y

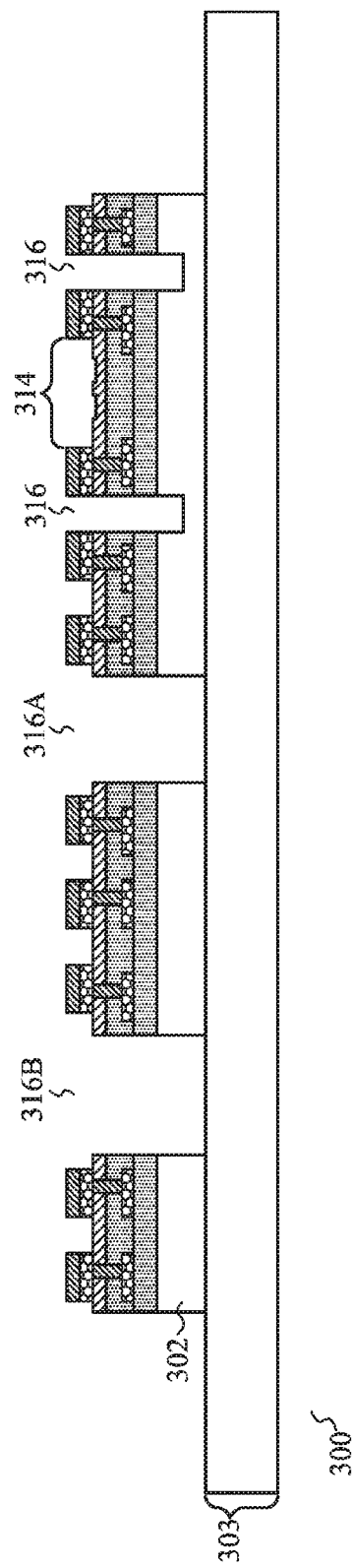

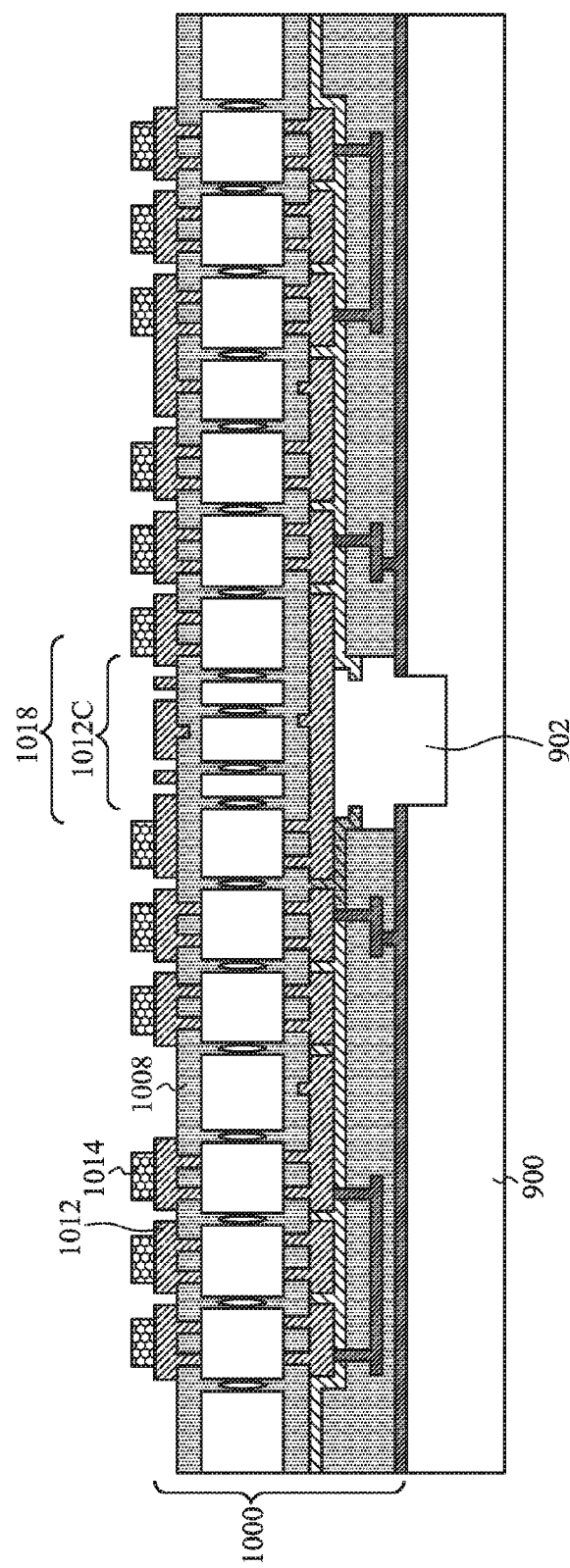

MEMS INTEGRATED PRESSURE SENSOR AND MICROPHONE DEVICES AND METHODS OF FORMING SAME

This application is a continuation of U.S. patent application Ser. No. 14/934,854, filed on Nov. 6, 2015, entitled "MEMS Integrated Pressure Sensor and Microphone Devices and Methods of Forming Same," which is a divisional application of U.S. patent application Ser. No. 13/944,382, filed on Jul. 17, 2013, entitled "MEMS Pressure Sensor, Motion Sensor, and Microphone Devices and Methods of Forming Same," now U.S. Pat. No. 9,187,317 issued Nov. 17, 2015, which claims the benefit of U.S. Provisional Application No. 61/783,401, filed on Mar. 14, 2013 entitled "MEMS Pressure Sensor, Motion Sensor, and Microphone Devices and Methods of Forming Same," which applications are hereby incorporated herein by reference.

CROSS-REFERENCE TO RELATED APPLICATIONS

This application relates to the following co-pending and commonly assigned patent applications filed on the same date: "MEMS Integrated Pressure Sensor Devices and Methods of Forming Same" (application Ser. No. 13/894,821); "MEMS Integrated Pressure Sensor Devices having Isotropic Cavities and Methods of Forming Same" (application Ser. No. 13/906,105); "MEMS Integrated Pressure Sensor and Microphone Devices having Through-Vias and Methods of Forming Same" (application Ser. No. 13/955,957); and "MEMS Device and Methods of Forming Same" (application Ser. No. 13/893,058).

BACKGROUND

Micro-electromechanical systems ("MEMS") are becoming increasingly popular, particularly as such devices are miniaturized and are integrated into integrated circuit manufacturing processes. MEMS devices introduce their own unique requirements into the integration process, however. Electrically interconnecting MEMS devices is an area of unique challenges. In particular, integrating MEMS pressure sensor devices, MEMS microphone devices, and other MEMS devices (e.g., motion sensor devices) into the same integrated circuit manufacturing process has posed challenges.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 3A-3I are cross-sectional views of intermediate stages of manufacture of a MEMS device in accordance with alternative various embodiments.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Figure 1A:
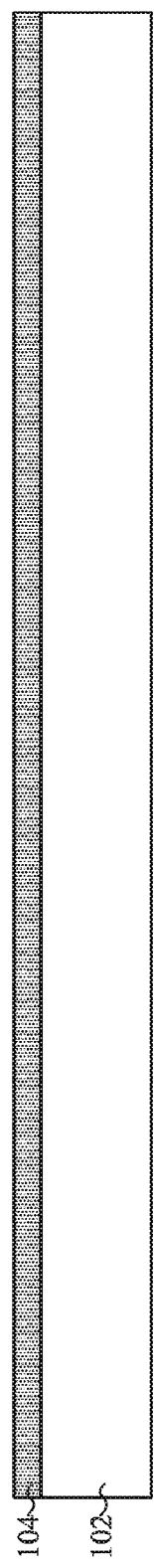
FIGS. 1A-1AB are cross-sectional views of intermediate stages of manufacture of a MEMS device in accordance with various embodiments.

FIGS. 1A-1AB illustrate cross-sectional views of intermediate stages of manufacture of a portion of a MEMs device 400 having a pressure sensor 402, a microphone 404, and another device 406 (see FIG. 1AB). Device 406 may be a MEMS motion sensor, a gyroscope, an accelerometer, or the like. Pressure sensor 402, microphone 404, and device 406 are manufactured using the same integrated circuit (IC) process. Therefore, various embodiments illustrated by FIGS. 1A-1AB allow for the smooth integration of manufacturing a MEMS pressure sensor and microphone devices using known IC manufacturing techniques.

FIGS. 1A-1L illustrate various intermediate stages of manufacture of a MEMS wafer 100 in accordance with various embodiments. As shown in FIG. 1A, MEMs wafer 100 includes a substrate 102 and a dielectric layer 104. Substrate 102 may be formed of silicon or other materials such as silicon germanium, silicon carbide, or the like. Substrate 102 may be formed of low resistive silicon. Alternatively, substrate 102 may be a silicon-on-insulator (SOI) substrate. SOI substrate may comprise a layer of semiconductor material (e.g., silicon, germanium, and the like) formed over an insulator layer (e.g., buried oxide), which is formed in a silicon substrate. In addition, other substrates that may be used include multi-layered substrates, gradient substrates, hybrid orientation substrates, and the like.

Dielectric layer 104 may be formed of a dielectric material, such as silicon dioxide ($SiO_2$). Dielectric layer 104 may be deposited over substrate 102 using, for example, spinning, chemical vapor disposition (CVD), plasma enhanced chemical vapor deposition (PECVD), low pressure CVD, or other suitable deposition techniques. Furthermore, dielectric layer 104 may be formed of a different suitable material such as low-k dielectrics (e.g., carbon doped oxides), extremely low-k dielectrics (e.g., porous carbon doped silicon dioxide), a polymer (e.g., polyimide), combinations thereof, or the like. Dielectric layer 104 may be released (i.e., removed) in subsequent process steps in order to form MEMS structures; therefore, dielectric layer 104 may also be referred to as oxide release layer 104, sacrificial layer 104, or sacrificial oxide layer 104.

Furthermore, voids (not shown) may or may not be embedded in oxide release layer 104 to alter oxide release time during a subsequent selective oxide etching process (e.g., vapor HF). Voids may be embedded by depositing and patterning a first portion of oxide release layer 104 to form a plurality of small openings using, for example, a combination of photolithography and etching techniques. The upper portions of the small openings may then be seamed together to seal the small openings, and create voids. The small openings may be seamed together using, for example, an oxide deposition process applied to the upper surface of first portion of oxide release layer 104. For example, the deposition of additional oxide material (i.e., the remaining portion of oxide release layer 104) over the first portion of oxide release layer 104 may be employed to seal off the upper portions of the openings. The oxide deposition may be formed using a deposition process such as CVD or the like. More particularly, by controlling the deposition process, the material of oxide release layer 104 may be deposited in a non-conformable manner. That is, the material of oxide release layer 104 may build up on the upper portions of the small openings faster than along the sidewalls and bottom of the small openings. This process leads to the formation of an overhang at the edge of the upper portion of the small openings, and as the deposition process continues, the overhangs will merge, sealing off the small openings with a plurality of seams and forming voids embedded in oxide release layer 104.

Figure 1B:
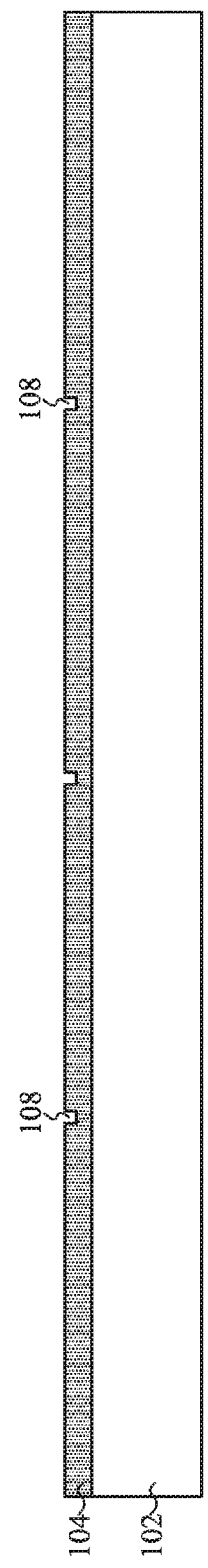
Figure 1C:
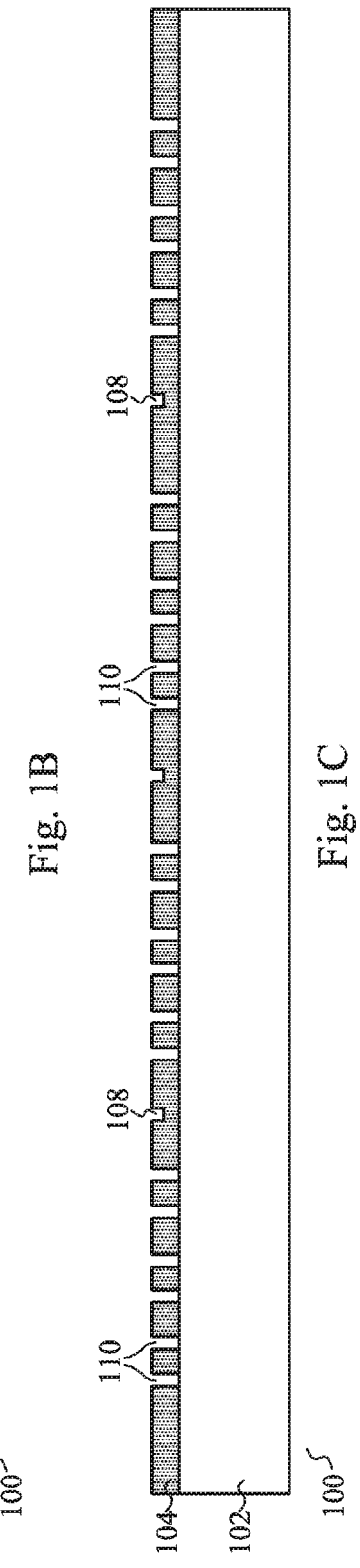

In FIGS. 1B and 1C, oxide release layer 104 is patterned, creating bump openings 108 and via openings 110. The patterning of oxide release layer 104 may be done using, for example, a combination of photolithography and etching techniques. Two separate photolithography steps may be performed in order to create bump openings 108 and via openings 110. For example, a shallow etching may be performed to create bump openings 108, while a deeper etching may be performed to create via openings 110. As shown in FIGS. 1B and 1C, bump openings 108 do not extend to substrate 102 while via openings 110 extend to and expose portions of substrate 102. Furthermore, oxide release layer 104 may be thinned (not shown) until a desired thickness is achieved. The thinning process may be implemented by using suitable techniques such as grinding, polishing, and/or chemical etching. For example, a chemical mechanical polishing (CMP) process may be used to thin oxide release layer 104. In accordance with various embodiments, the thickness of oxide release layer 104 is in a range from about 0.5 µm to about 5 µm.

In FIG. 1D, a layer 112 is deposited over oxide release layer 104 using, for example, CVD. Layer 112 may be made of polysilicon, and may be referred to as polysilicon layer 112 hereinafter. Polysilicon layer 112 fills via openings 110 and bump openings 108, forming polysilicon vias 112A and polysilicon bumps 112B respectively. Polysilicon vias 112A may be formed for electrical routing and may further act as a mechanical structure. For example polysilicon vias 112A may be used as a vapor hydrogen-fluoride (vapor HF) etch stop layer in subsequent process steps. Furthermore, in some embodiments, polysilicon bumps 112B may be used as mechanical bumps to limit the motion of moving elements in MEMS device 400, or as anti-stiction bumps. In alternative embodiments, layer 112 may be formed of a different material in lieu of polysilicon such as SiGe, single crystal silicon (e.g., by using a silicon-on-insulator wafer as a starting material), and the like. It should be noted that while a single polysilicon layer is illustrated, those skilled in the art will recognize that multiple polysilicon layers could be employed.

An oxide mask layer 114 (labeled as 114A and 114B) may be formed and patterned over portions of polysilicon layer 112. Oxide mask layer 114 is formed out of a similar material and using similar methods as oxide release layer 104, and oxide mask layer 114 may be patterned using for example, a combination of photolithography and etching. Oxide mask layer 114 acts as protection for critical portions of polysilicon layer 112 in subsequent process steps. For example, in FIG. 1D, oxide mask layer protects portions of polysilicon layer 112 to ensure proper thickness control and surface texture. Oxide mask layer 114 may be formed over any portion of polysilicon layer 112 where such control is desired. If surface texture and thickness is not crucial, oxide mask layer 114 may be omitted.

In FIG. 1E, polysilicon layer 112 is patterned using for example a combination of photolithography and etching. The patterning of polysilicon layer 112 may be done in order to create portions of various devices in MEMS device 400. For example, the patterning of polysilicon layer 112 in FIG. 1E creates separate portions of polysilicon layer 112 for inclusion as a bottom electrode of a motion sensor (or other applicable device), a membrane of a pressure sensor, and a membrane of a microphone device respectively.

In FIG. 1F, etch stop layer 116 is formed and patterned over oxide release layer 104 and polysilicon layer 112. Etch stop layer 116 may be deposited using, for example, low pressure chemical vapor deposition (LPCVD). Etch stop layer 116 may be patterned (e.g., using photolithography and etching) to expose portions of oxide mask layer 114. Etch stop layer 116 may be used as a vapor HF etch stop layer and may be formed of a low-stress nitride (LSN). However, other materials such as aluminum nitride, silicon carbide, or other dielectrics chemically resistant to vapor HF may be used as well.

In FIG. 1G, oxide mask layer 114 and polysilicon layer 112 are patterned to include release holes 117 and to expose portions of oxide release layer 104. The patterning process may be done using, for example, a combination of photolithography and etching. Release holes 117 provide a path to remove oxide release layer 104 in subsequent process steps. The portion of polysilicon layer 112 disposed near release holes 117 may be used as a membrane of a microphone device in MEMS device 400 (see element 404 in FIG. 1AB).

Figure 1H:
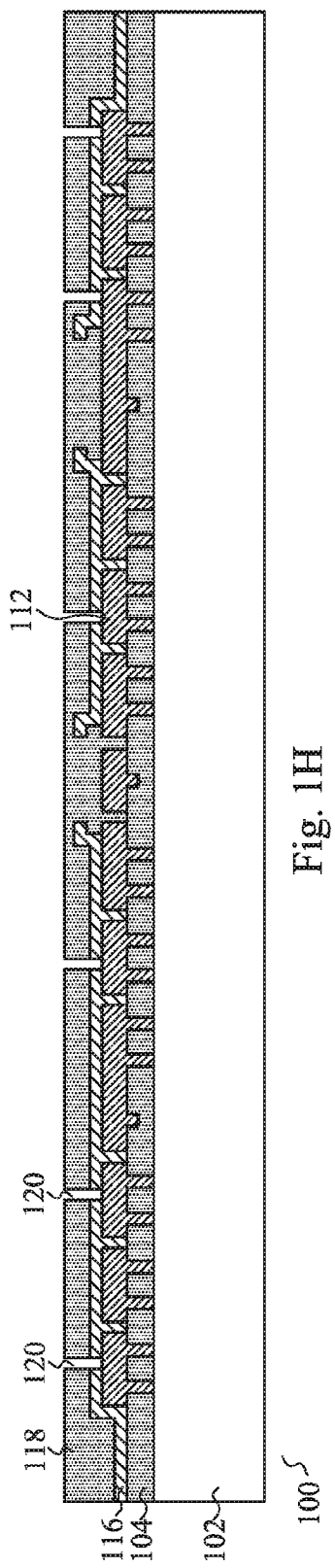

FIG. 1H illustrates the formation and patterning of another oxide release layer 118. Oxide release layer 118 may be formed of substantially the same material and using substantially the same methods as oxide release layer 104. The thickness of oxide release layers 104 and 118 may be designed to control parasitic feedback through capacitance and/or the gap between the subsequent movable element of MEMS wafer 100 and thin polysilicon layer 122. Oxide release layer 118 may be blanket deposited and then undergo a thinning process (e.g., CMP or etch-back) to reach a desired flatness and/or thickness. Oxide release layer 118 (and corresponding portions of etch stop layer 116) is patterned to create via openings 120, exposing portions of polysilicon layer 112, using for example, a combination of photolithography and etching.

Figure 1I:
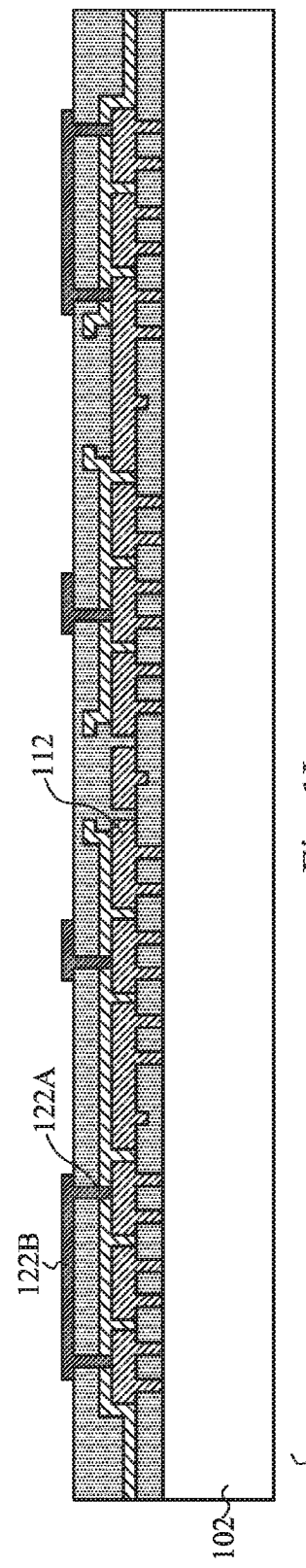

FIG. 1I illustrates the formation of a thin polysilicon layer 122 over oxide release layer 118. Thin polysilicon layer 122 may formed on oxide release layer 118 using suitable techniques such as CVD, and the like. Thin polysilicon layer 122 is deposited into via openings 120, creating via portions 122A. Thin polysilicon layer 122 may act as electrical routing and an interconnect structure (e.g., using via portions 122A and line portions 122B electrically connecting separate portions of polysilicon layer 112).

Figure 1J:
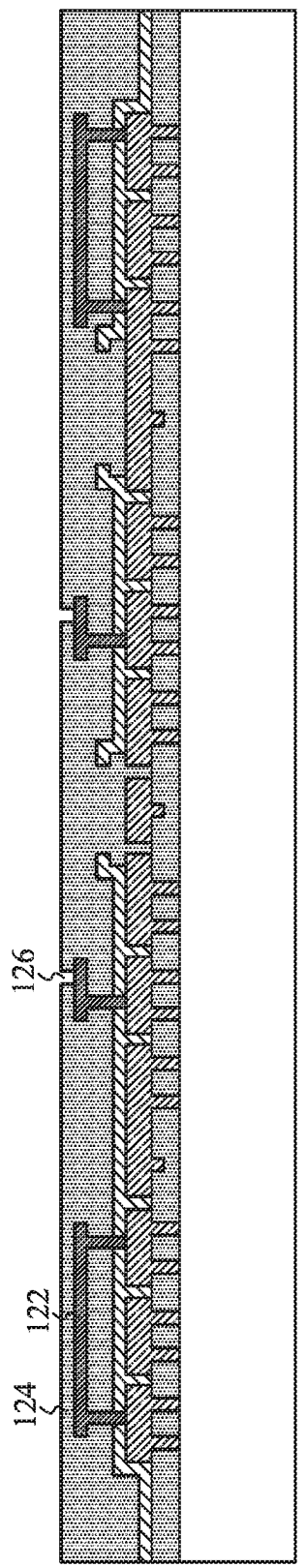
Figure 1K:
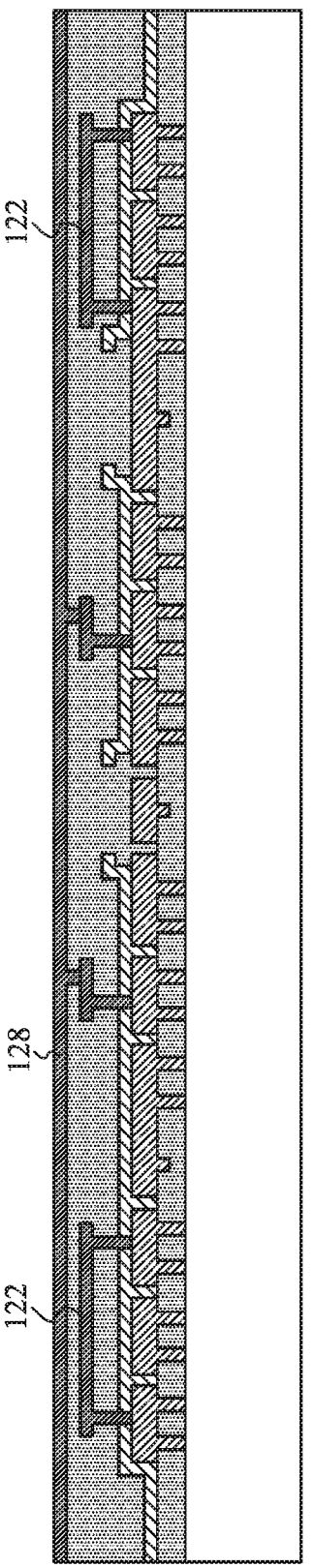

FIGS. 1J and 1K illustrate the formation of yet another oxide release layer 124 and a thin polysilicon layer 128. Oxide release layer 124 and thin polysilicon layer 128 may be substantially similar to and formed in substantially the same manner as oxide release layers 104 and 118 and thin polysilicon layer 122 respectively. The formation of thin polysilicon layer 128 may include first patterning oxide release layer 124 to form openings 126. Subsequently, openings 126 are filled with a polysilicon material to form via portions interconnected to portions of thin polysilicon layer 122.

Thin polysilicon layer 128 also acts as a shield for various components of MEMS wafer 100 (e.g., substrate 102 and polysilicon layer 112) in subsequent process steps. Thin polysilicon layer 128 may also act as a bonding interface layer; therefore, other suitable bonding materials such as silicon, amorphous silicon, silicon doped with impurities, combinations thereof, and the like may be used in lieu of polysilicon.

In FIG. 1L, portions of thin polysilicon layer 128 and various oxide layers (i.e., oxide release layers 118 and 124 and oxide mask layer 114) are etched, creating opening 130. This may be done using, for example, a combination of wet and dry etching techniques. Notably, opening 130 exposes region 132 of polysilicon layer 112. Region 132 of polysilicon layer 112 may act as a membrane of a pressure sensor device in completed MEMS device 400 (e.g., see element 402 in FIG. 1AB). In a completed MEMS device 400, opening 130 exposes this portion of polysilicon layer 112 to a type of pressure (e.g., ambient pressure or sealed pressure depending on the design of MEMS device 400). The etching of thin polysilicon layer 128, oxide release layers 124 and 118, and oxide mask layer 114 completes a MEMS wafer 100 for inclusion in MEMS device 400. MEMS wafer 100 has a top and bottom surface, 100A and 100B respectively.

In FIG. 1M, MEMS wafer 100 is bonded to a carrier wafer 200. Carrier wafer 200 may be a substrate that is substantially similar to substrate 102 in MEMS wafer 100. Carrier wafer 200 includes a cavity 202, which was formed using for example etching techniques. Carrier wafer 200 also has a top and bottom surface, 200A and 200B respectively.

Top surface 100A of MEMS wafer 100 is bonded to top surface 200A of carrier wafer 200. Opening 130 of MEMS wafer 100 may in connection with cavity 202 of carrier wafer 200. MEMS wafer 100 may be bonded to carrier wafer 200 using any suitable technique such as fusion bonding, anodic bonding, eutectic bonding, and the like. In various embodiments, MEMS wafer 100 may be fusion bonded to carrier wafer 200 using thin polysilicon layer 128 as a bonding interface. The fusion bonding process may define a pressure level of cavity 202.

Furthermore, MEMS wafer 100 may be thinned to a desired thickness T3. The thinning process may include grinding and chemical mechanical polishing (CMP) processes, etch back processes, or other acceptable processes performed on surface 100B of MEMS wafer 100 (i.e., substrate 102). As a result of this thinning process, MEMS wafer 100 may have a thickness between about 5 μm to about 60 μm.

Figure 1N:
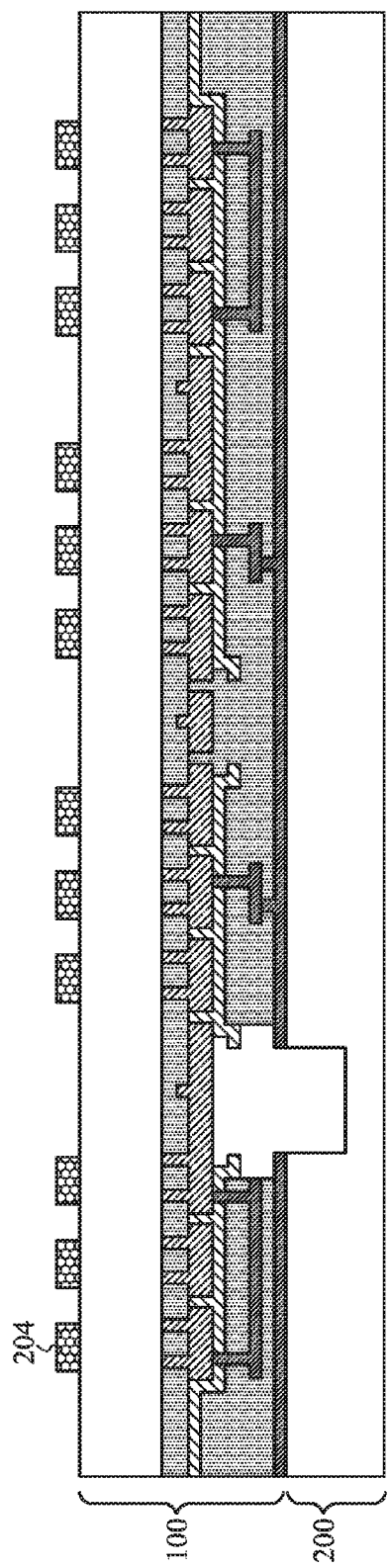

In FIG. 1N, conductive bonds 204 are formed and patterned over substrate 102 (i.e., bottom surface 100B of MEMS wafer 100). Conductive bonds 204 may be formed of aluminum copper (AlCu) and are used for eutectic bonding in subsequent process steps. Alternatively, a different conductive material suitable for eutectic bonding such as Ge, Au, combinations thereof, or the like may be used instead.

In FIG. 1O, portions of substrate 102 are patterned using for example, a combination of photolithography and etching. The portions of the remaining substrate 102 may form various MEMS structures (e.g., MEMS structures 212, 214, and 216). MEMS structure 212 may act as a bottom electrode of a pressure sensor device in finished MEMS device 400. MEMS structure 214 may act as a bottom electrode of a microphone device in finished MEMS device 400. MEMS structure 216 may be patterned to act as a proof mass of a motion sensor device in finished MEMS device 400. Alternatively, MEMS structure 216 may be patterned to be portions of other MEMS devices such as a spring (e.g., for a gyroscope), a series of fingers in a comb (e.g., for an accelerometer), or the like.

Figure 1P:
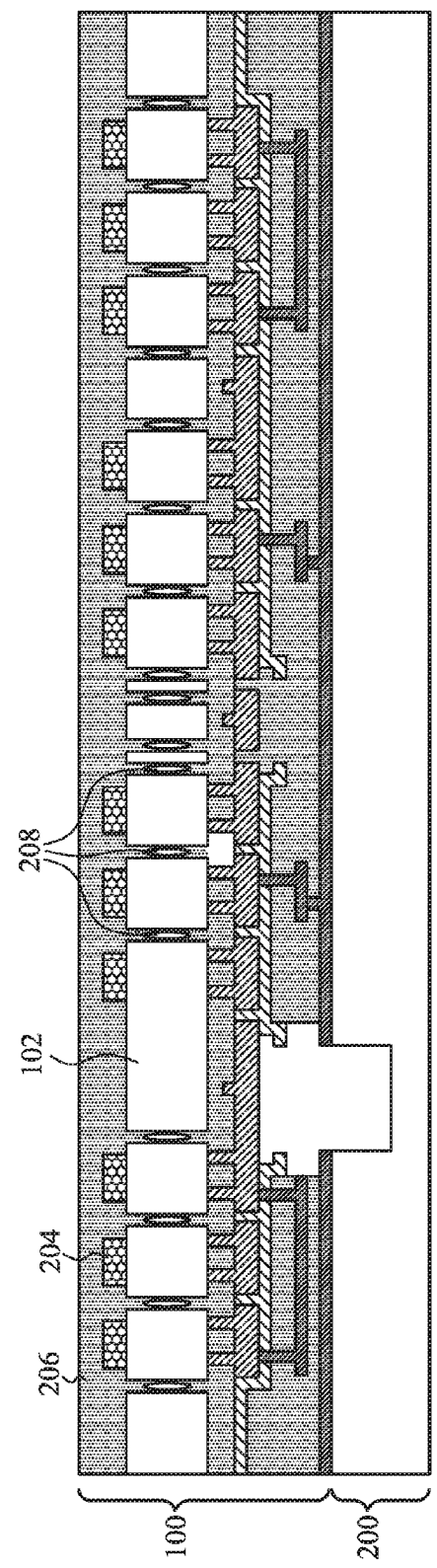

In FIG. 1P, an oxide release layer 206 is formed over and covering bonds 204. Oxide release layer 206 may be substantially similar to and formed in the same manner as oxide release layer 104. It should be noted that oxide release layer 206 may be formed through multiple oxide deposition processes and their corresponding etch-back processes. Oxide release layer 206 may include voids 208 disposed between remaining portions of substrate 102 (e.g., MEMS structures 212, 214, and 216). Oxide release layer 206 may be used as a protective layer for MEMS wafer 100 during subsequent process steps (e.g., the etching of carrier wafer 200 illustrated in FIG. 1Q).

Figure 1Q:
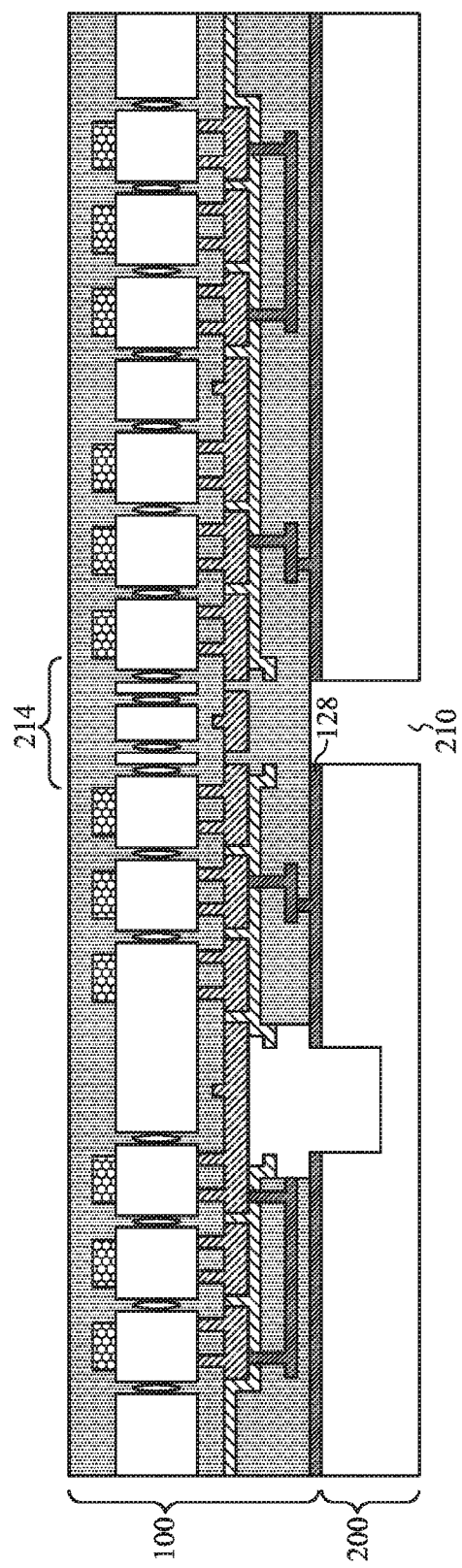

In FIG. 1Q, cavity 210 is formed in carrier wafer 200. Cavity 210 may be formed by etching carrier wafer 200 and thin polysilicon layer 128 to expose a portion of oxide release layer 124 in MEMS wafer 100 corresponding to MEMS structure 214.

Figure 1R:
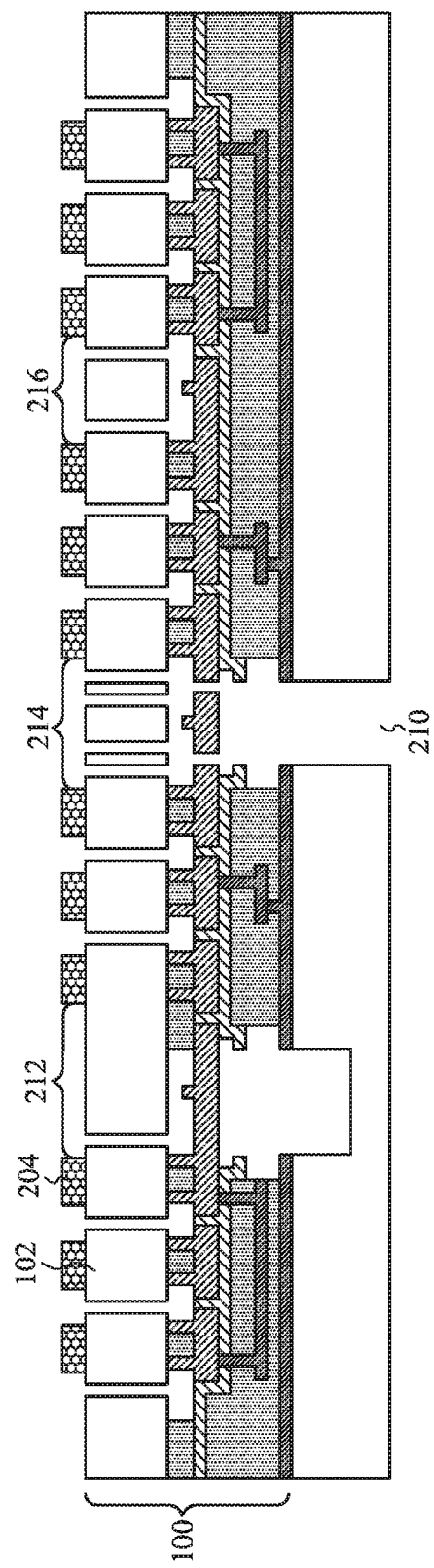

FIG. 1R illustrates the release of the MEMS structures 212, 214, and 216 by a vapor HF etching of portions of various oxide release layers 104, 118, 124, and 206. This type of etch process has a high selectivity between the various oxide release layers (104, 118, 124, and 206) and etch stop layer 116, polysilicon layer 112, thin polysilicon layers 122 and 128, and carrier wafer 200 so that that polysilicon layers 112, 122, and 128, carrier wafer 200, and etch stop layer 116 are not significantly attacked during the removal of portions of the various oxide release layers 104, 118, 124, and 206. Furthermore, portions of polysilicon layers 112 (e.g., vias 112A) and etch stop layer 116 protect portions of the various oxide release layers during the etch process, and these protected regions (i.e., the remaining portions of the various oxide release layers) may be referred to as anchor regions. This etch process allows for free movement of the movable elements of MEMS structure 216 in at least one axis. Furthermore, MEMS structures 212 and 214 may be designed to be stiff and having a relatively limited range of motion even after the vapor HF process. It should be noted that the portions of oxide release layers to be removed depend on layout design.

Figure 1S:
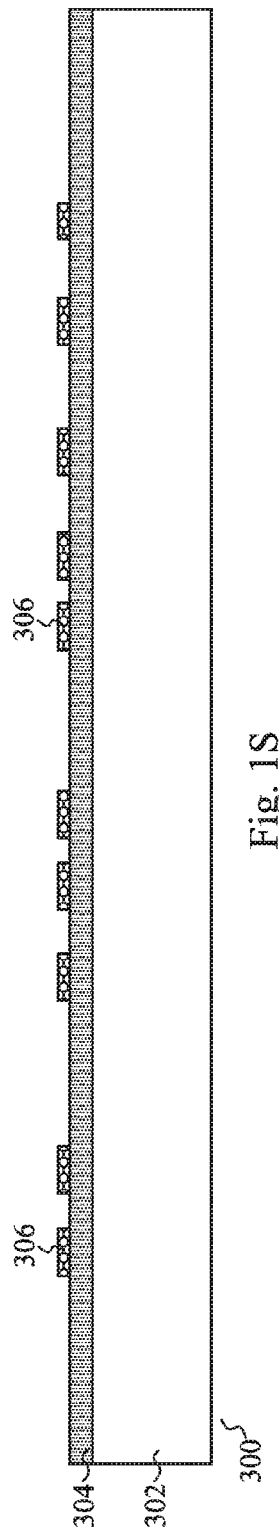

FIGS. 1S-1Z illustrate various intermediate steps of manufacture of a cap wafer 300 for inclusion in the completed MEMS device 400. Cap wafer 300 may or may not be a CMOS wafer, which may or may not have electrical circuits (not shown). In particular cap wafer 300 may include various active devices such as transistors, capacitors, resistors, diodes, photodiodes, fuses and the like. The electrical circuits may be interconnected to perform one or more functions suitable for a particular application, which may or may not be related to MEMS structures 212, 214, and 216. FIG. 1S illustrates cap wafer 300 as having substrate 302, oxide layer 304, and patterned metal lines 306. Metal lines 306 may be used for electrical routing. Metal lines 306 may be formed of, for example, AlCu although other metallic materials may be used to form metal lines 306 as well.

Figure 1T:
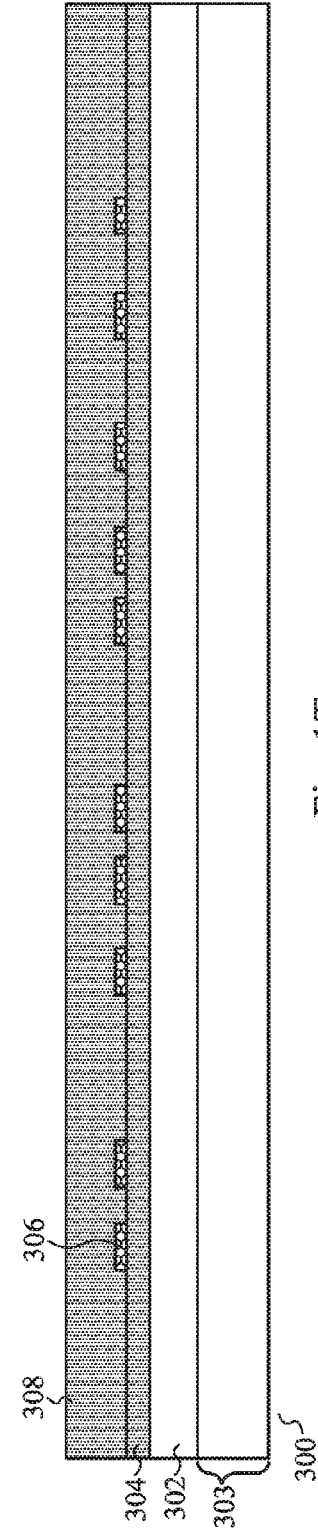

In FIG. 1T, substrate 302 is thinned for example using a known grinding technique such as CMP. Cap wafer 300 is attached to a temporary handle wafer 303. Temporary handle wafer 303 may be formed of, for example, glass or silicon. Substrate 302 may be attached to temporary handle wafer 303 using a temporary adhesive such as UV tape, wax, glue, or the like. Furthermore, a conforming oxide layer 308 is formed over metal lines 306. Conforming oxide layer 308 may be deposited using any suitable technique, such as CVD and may be formed of a low-k dielectric material.

Figure 1U:
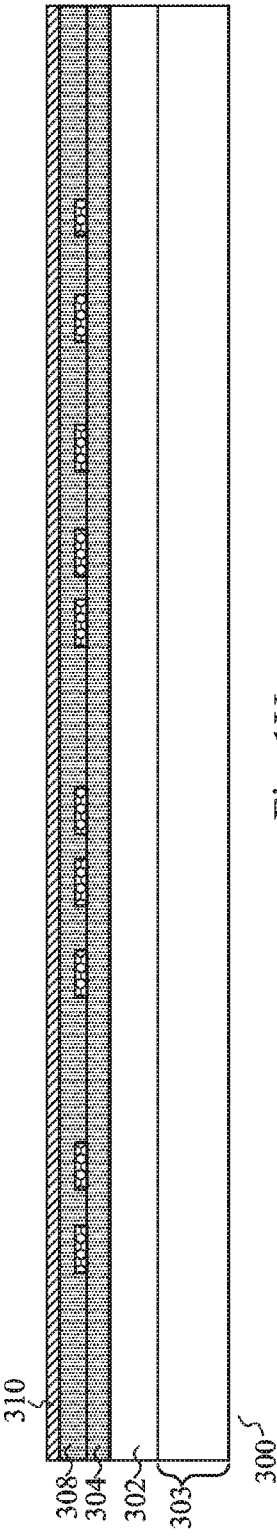

In FIG. 1U, conforming oxide layer 308 has undergone a process (e.g., CMP) to achieve a desired topography and thickness. A film layer 310 is deposited over conforming oxide layer 308 using a suitable technique such as CVD. In some embodiments, film layer 310 is formed of silicon nitride and is used as a passivation layer. Alternatively, film layer 310 may be formed of a dielectric material such as an oxide or the like. In subsequent process steps, portions of film layer 310 may be patterned to create mechanical bumps in cap wafer 300.

Figure 1V:
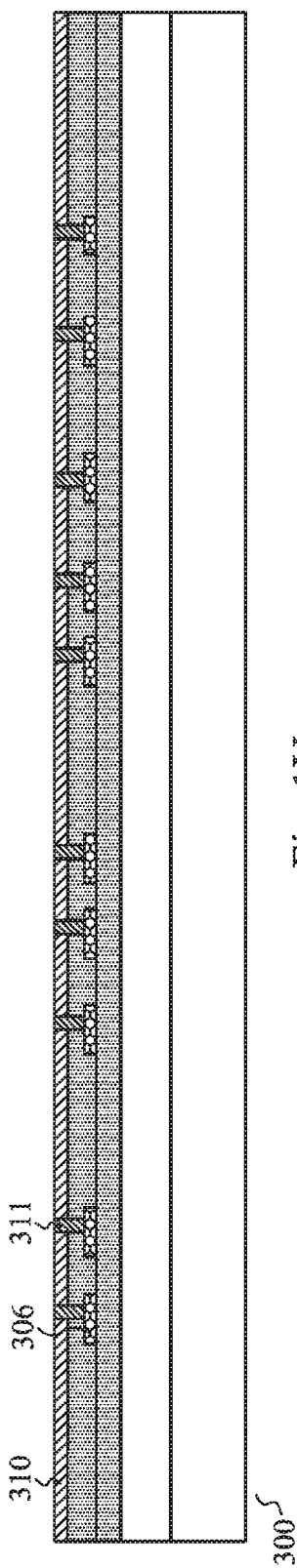

FIG. 1V illustrates insertion of contact plugs 311 into cap wafer 300. Contact plugs 311 may be formed of tungsten, although other metallic materials such as aluminum or copper may also be used. Contact plugs 311 may be formed for example, by patterning film layer 310 and conforming oxide layer 308, exposing metal lines 306. A metallic material (e.g., tungsten) may be deposited in the patterned openings and a CMP technique may be used so that the top surface of contact plugs 311 may be level with the top surface of film layer 310. Contact plugs 311 are electrically connected to metal lines 306.

Figure 1W:
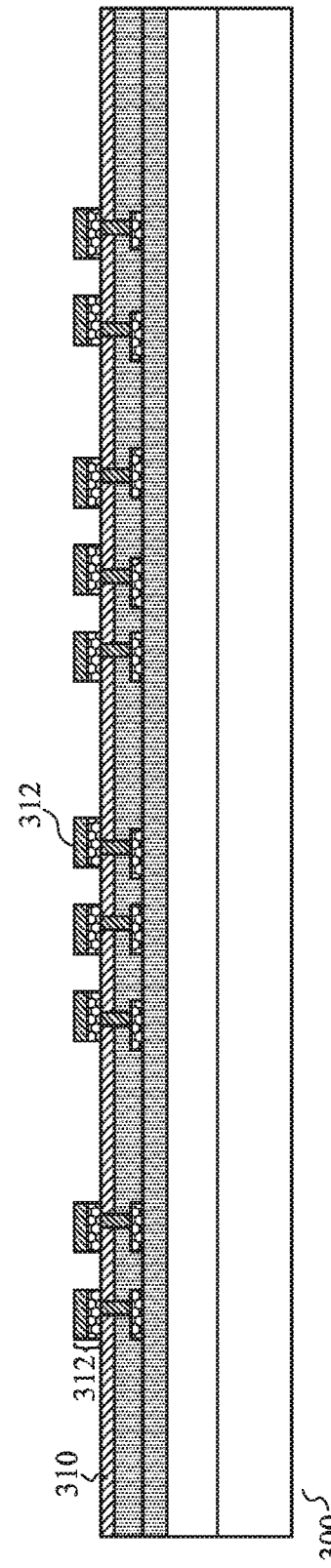
Figure 1A:
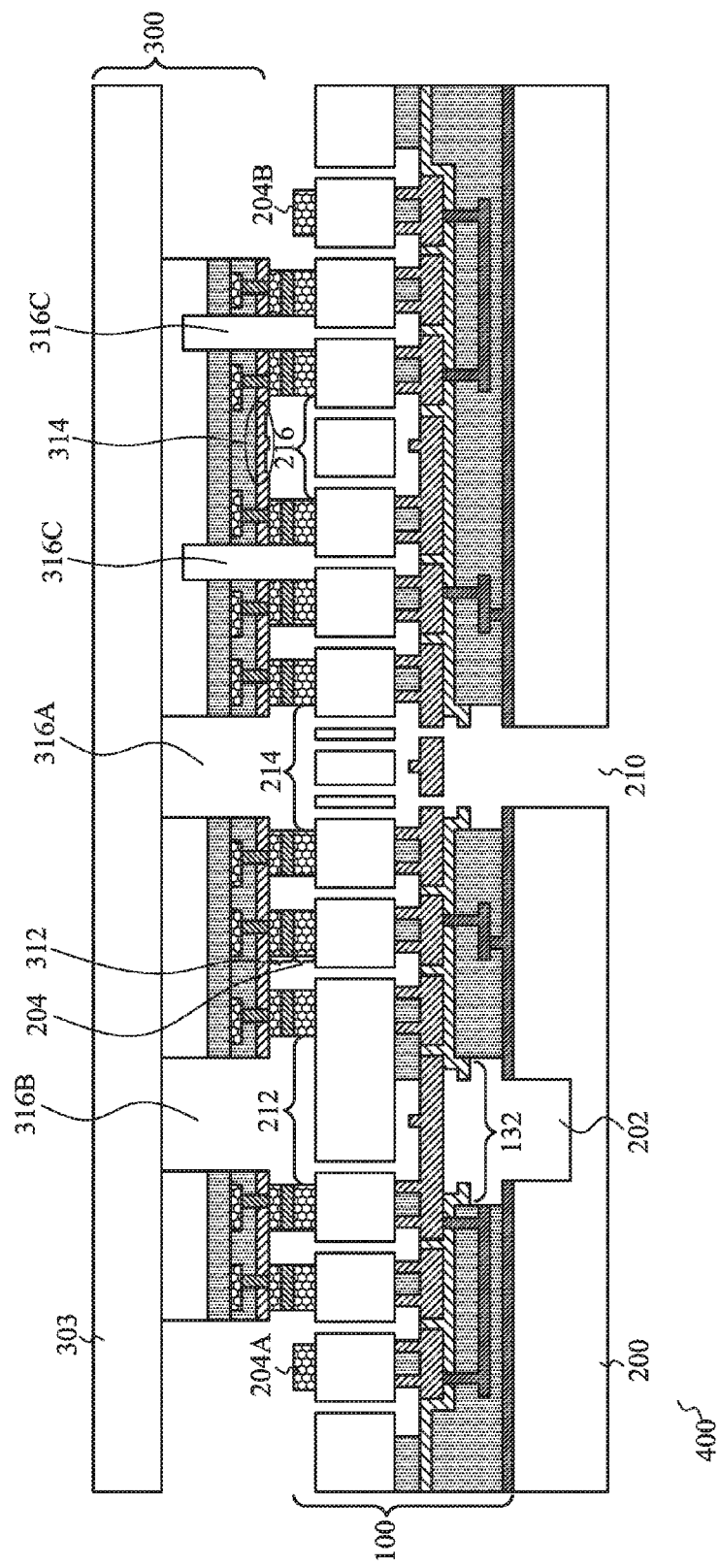
Figure 1A:
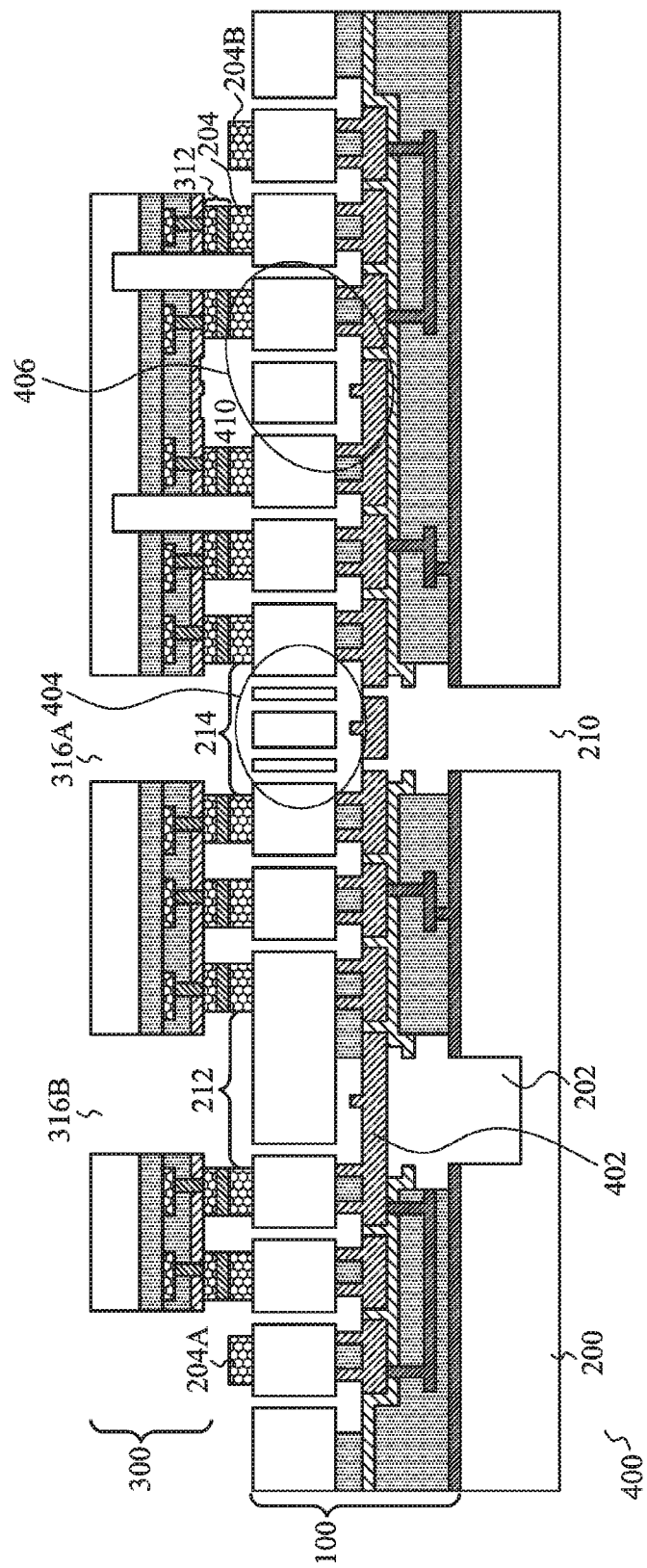

In FIG. 1W, bonding material layers 312 (alternatively referred to as bonds 312) are formed over a top surface of film layer 310. Bonding material layers 312 may be blanket deposited and patterned using for example physical vapor deposition (PVD) and photolithography/etching. Bonding material layers 312 may be made of a layer of aluminum copper under a layer of germanium although other metallic materials such as gold may also be used. Bonding material layers 312 may act as a eutectic bonding material for a subsequent bonding process. Bonding material layers 312 may or may not be electrically connected to metal lines 306 via contact plugs 311.

In FIG. 1X, a shallow etching is performed on portions of film layer 310. Portions of film layer 310 may be shallow etched to form bumps 314. Bumps 314 may serve a variety of purposes. For example, in an embodiment, bumps 314 are mechanical bumps included to limit the motion of moving elements in MEMS wafer 100. Bumps 314 may also be used as anti-stiction bumps.

In FIG. 1Y, cavities 316 (including cavities 316A and 316B) are formed in cap wafer 300. Cavities 316 do not penetrate through the entire thickness of substrate 302 (i.e., temporary handle wafer 303 is not exposed by cavities 316). The formation of cavities 316 may include known etching techniques employing an etch loading effect.

In FIG. 1Z, an additional etching is performed on selective cavities 316 (i.e., cavity 316A, 316B, and edge portions) to expose temporary handle wafer 303. However, other cavities 316 may not be etched further and do not expose handle wafer 303.

FIG. 1AA illustrates the stacked MEMS device 400, wherein cap wafer 300 is stacked over MEMS wafer 100 and carrier wafer 200. Cap wafer 300 may be bonded to MEMS wafer 100 by eutectic bonding between the bonds 204 and bonds 312. Certain bonds 204 (i.e., bonds 204A and 204B) may not be bonded to bonds 312. These bonds 204A and 204B may be used as input/output pads to electrically connect MEMS device 400 to external electronic circuits (not shown).

As shown in FIG. 1AA, through the eutectic bonding process, moveable elements (e.g., MEMS structure 216) may be located between a polysilicon layer 112 and cap wafer 300. Furthermore, cap wafer 300 and MEMS wafer 100 are aligned so that cavity 316B, cavity 316A, and bumps 314 are aligned with MEMS structures 212, 214, and 216 respectively. MEMS structure 216 is disposed in sealed cavities defined by the eutectic bonding. That is, in a top-down view of portions of MEMS device 400 (not shown), at least a portion of the eutectic bonds formed between bonds 204 and 312 form closed loops, sealing MEMS structure 216 in an enclosed cavity.

However, certain other bonds 204 and 312 may not form closed loops and be included for electrical connections. For example the enclosed cavity containing MEMS structure 216 may include cavities 316C, having free air flow around applicable bonds 204 and 312 (i.e., bonds 204 and 312 adjacent to MEMS structure 216). Furthermore, by selecting an appropriate volume for cavities 316C an appropriate pressure level for the sealed cavity may be adjusted using known physical relationships (i.e., the ideal gas law dictates that PV=nRT and as volume increases, pressure decreases).

In FIG. 1AB, temporary handle wafer 303 is removed, exposing cavities 316A and 316B and corresponding MEMS structures 212 and 214 to an ambient environment. The removal of temporary handle wafer 303 also exposes and provides access to input/output bonds 204A and 204B.

FIG. 1AB illustrates a completed MEMS device 400 in accordance with various embodiments. MEMS device 400 includes a pressure sensor 402, a microphone 404, and another device 406. Pressure sensor 402 includes a membrane (i.e., region 132 of polysilicon layer 112). The membrane is exposed to ambient pressure on one surface (e.g., through cavity 316B) and sealed pressure on the other surface (e.g., through sealed cavity 202). The pressure of sealed cavity 202 may be defined by the conditions of the bonding process (e.g., fusion bonding) between MEMS wafer 100 and carrier wafer 200. For example, the fusion bonding process may be performed in a chamber having an appropriate pressure level to define a pressure of about $10^{-4}$ mbar to about 1 bar in sealed cavity 202. Therefore, pressure sensor 402 may detect ambient pressure by comparing the pressure difference between cavity 316B (ambient pressure) and sealed cavity 202. Microphone 404 includes moving elements 214 and a membrane. The membrane is exposed to ambient pressure on both sides through cavities 316A and 210. MEMS structures 212 and 214 may function as bottom electrodes for pressure sensor 402 and microphone 404 respectively.

Device 406 may be a motion sensor that allows for the detection of motion through the disposition of a proof mass (i.e., MEMS structure 216) over an electrode (i.e., portions of polysilicon layer 112) in a sealed cavity 410 having pressure defined by eutectic bonding. Alternatively, device 406 may be an accelerometer, a gyroscope, or the like. The pressure of sealed cavity 410 may be selected in accordance with the desired functionality of device 406. For example, sealed cavity 410 may have a pressure between about 100-700 mbar for an accelerometer, between about $10^{-4}$ mbar to about 10 mbar for a gyroscope, or the like. Thus, using the various formation steps illustrated in FIGS. 1A-1AB, a pressure sensor, microphone, and another MEMS device may be formed using the same MEMS manufacturing process.

FIGS. 2A-2E illustrate cross-sectional views of various stages of manufacture of a MEMS device 800 (see FIG. 2E) in accordance with alternative embodiments.

Figure 2A:
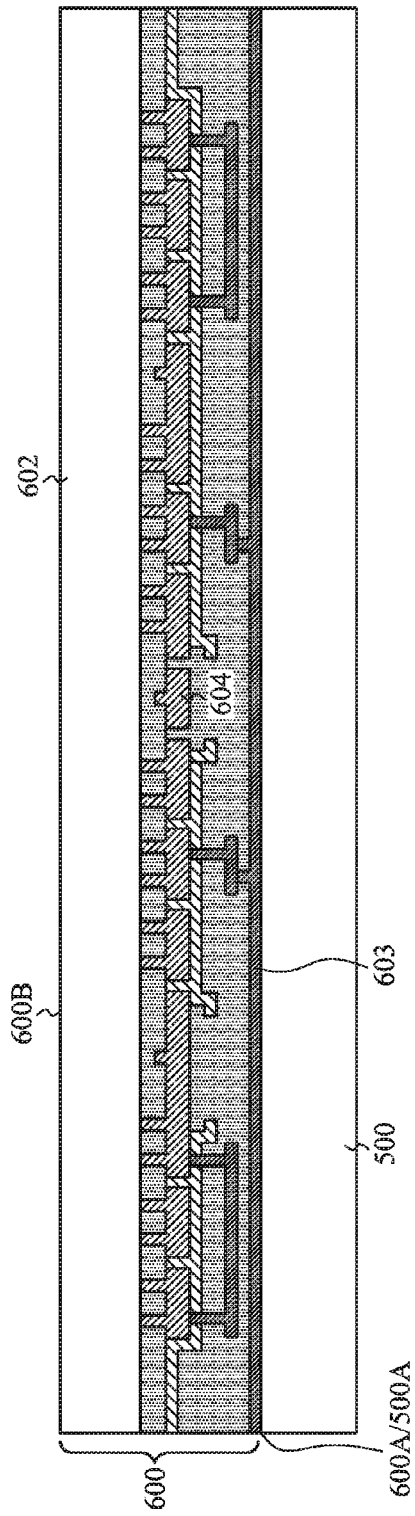
FIGS. 2A-2E are cross-sectional views of intermediate stages of manufacture of a MEMS device in accordance with alternative various embodiments.

In FIG. 2A, a cross-sectional view of a MEMS wafer 600 bonded to a carrier wafer 500. MEMS wafer 600 and carrier wafer 500 may be substantially similar to MEMS wafer 100 and carrier wafer 200 of MEMS device 400. In particular MEMs wafer 600 includes a substrate 602 and a patterned polysilicon layer 604. Therefore, detailed description of MEMS wafer 600 and carrier wafer 500 are omitted for brevity. However, MEMS wafer 100 and carrier wafer 500 may not include opening 130 and cavity 202 respectively. In fact, the MEMS wafer 600 and carrier wafer 500 illustrated in FIG. 2A may be substantially free of any cavities or openings. MEMS wafer 600 may be bonded to carrier wafer

500 using known bonding processes such as fusion bonding with a bonding layer 603, which may be a thin polysilicon layer.

Figure 2B:
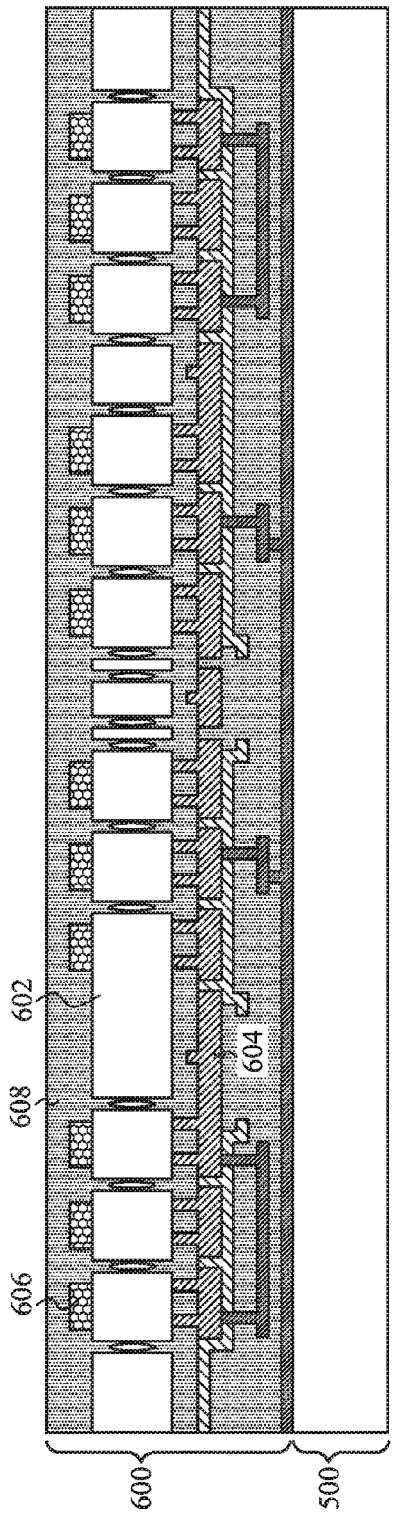

In FIG. 2B, portions of a substrate 602 in MEMS wafer 600 has been patterned. Furthermore bonds 606 have been formed over substrate 602, and an oxide release layer 608 has been formed over and covering metal bonds 606. Substrate 602 may be patterned using substantially the same methods used in patterning substrate 102 in MEMS wafer 100. Furthermore, bonds 606 and oxide release layer 608 may be substantially similar to bonds 204 and oxide release layer 206 in MEMS device 400 respectively. Therefore, detailed descriptions of these features are omitted for brevity. Oxide release layer 608 may be used as a protection layer for the features of MEMS wafer 600 in subsequent process steps.

Figure 2C:
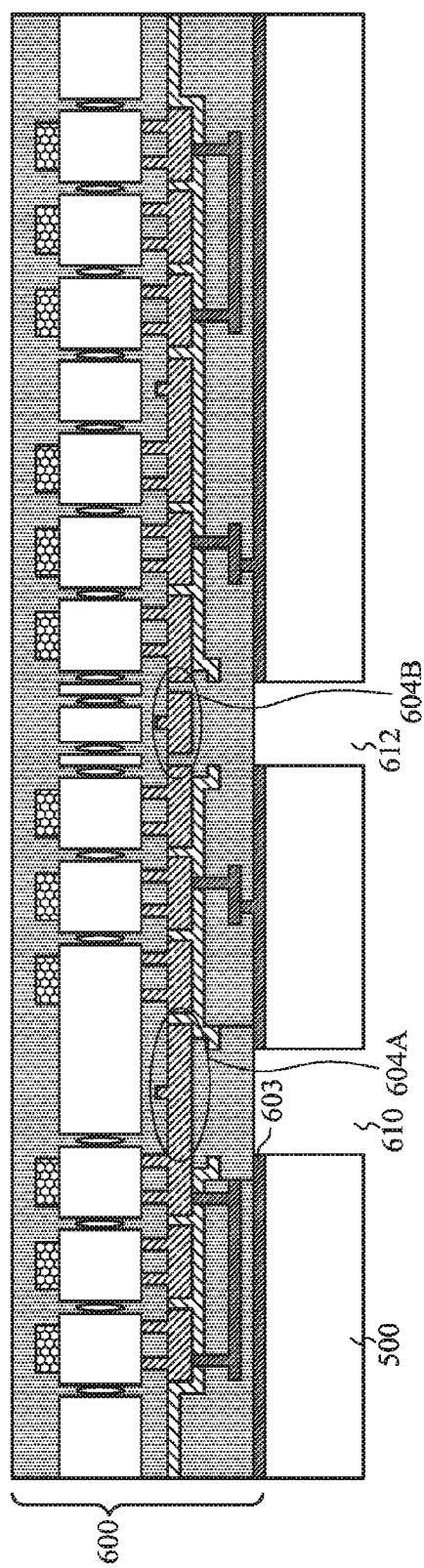

In FIG. 2C, portions of carrier wafer 500 are removed for example by etching to create openings 610 and 612. Openings 610 and 612 correspond to portions of MEMS wafer 600 and polysilicon layer 604 that will become a pressure sensor and a microphone in a completed MEMS device (e.g., portions 604A and 604B of polysilicon layer 604 respectively). Furthermore, portions of bonding layer 603 corresponding to openings 610 and 612 are also removed.

Figure 2D:
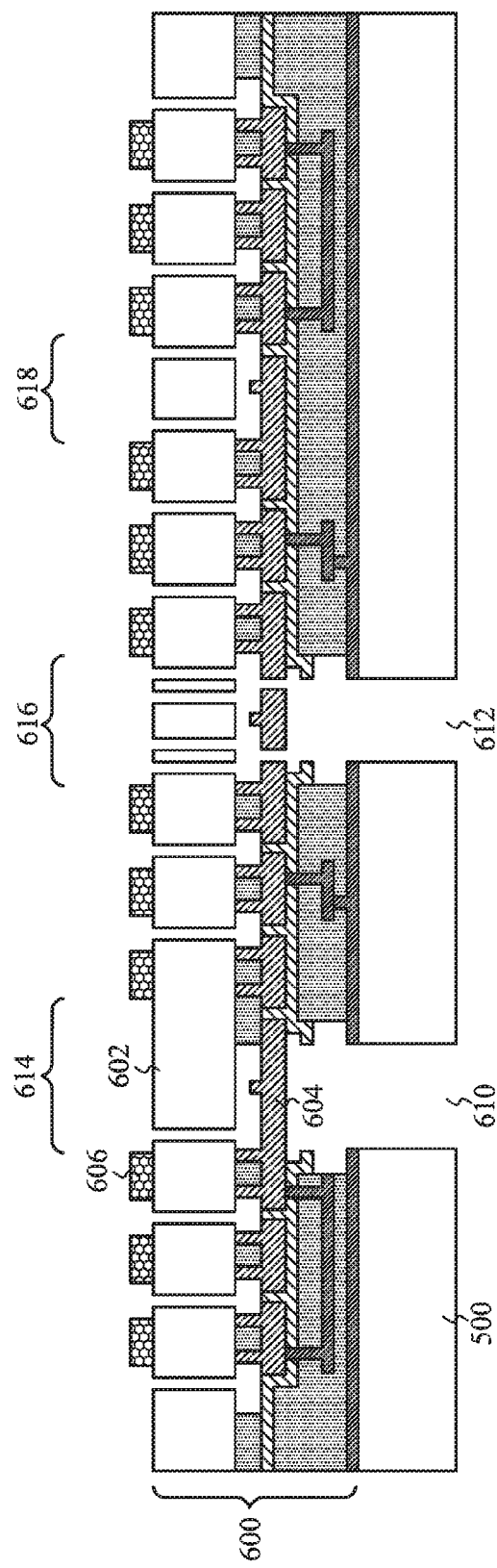

FIG. 2D illustrates the release of the MEMS structures 614, 616, and 618 by a vapor HF etching of portions of oxide release layer 608 and various oxide release layers in MEMS wafer 600. This type of etch process has a high selectivity between oxide release layers and other features in MEMS wafer 600 so that that the other features are not significantly attacked during the removal of portions of the various oxide release layers. Furthermore, polysilicon layer 604 protects portions of oxide release layers during the etch process, and these protected regions may be referred to as anchor regions. This etch process allows for free movement of the movable elements of MEMS structure 618 in at least one axis. Furthermore, MEMS structure 614 and 616 may be designed to be stiff and having a relatively limited range of motion even after the vapor HF process. It should be noted that the oxide release layers to be removed depend on layout design.

Figure 2E:
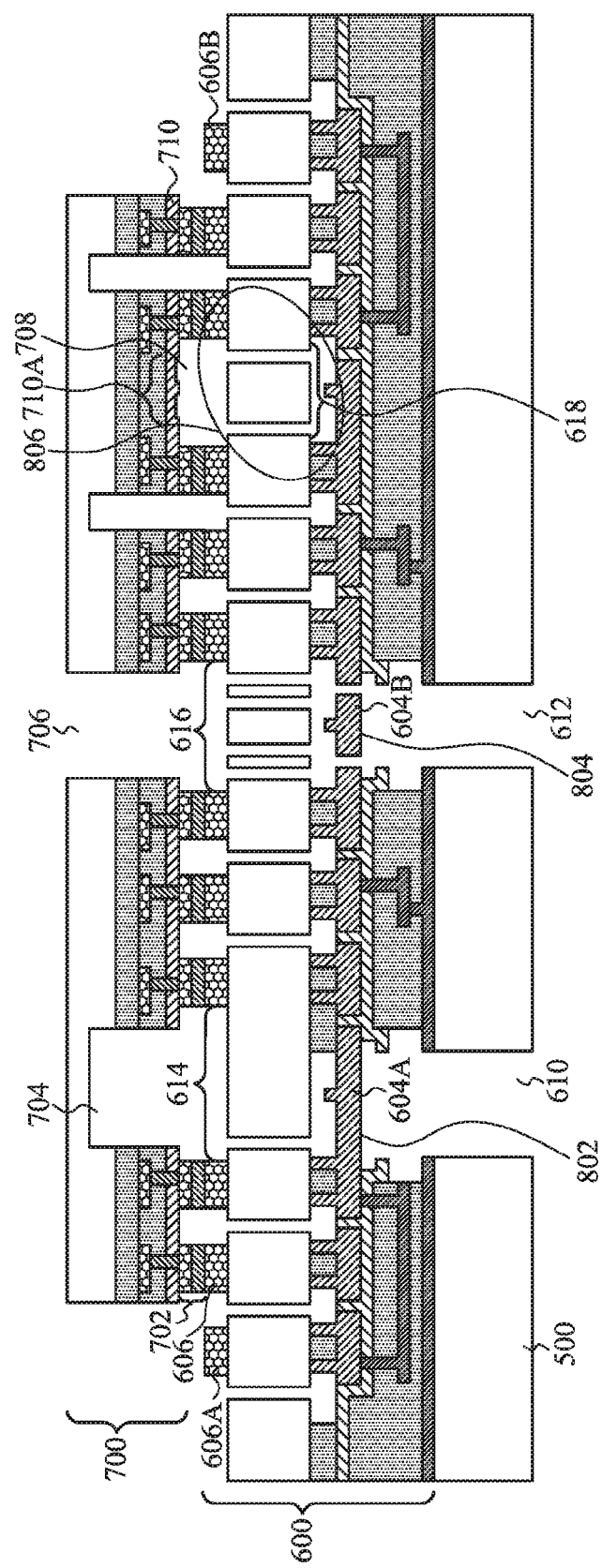

FIG. 2E illustrates the eutectic bonding of MEMS wafer 600 (bonded to carrier wafer 500) to a cap wafer 700. Cap wafer 700 includes film layer 710 (having bumps 710A), cavity 704, opening 706, and metal bonds 702. Cap wafer 700 is substantially similar to cap wafer 300 in MEMS device 400, and cap wafer 700 may be formed using substantially the same process steps as cap wafer 300. Therefore, detailed description of cap wafer 700 is excluded for brevity. Bonds 702 are eutectically bonded to bonds 606 of MEMS wafer 600. However, certain bonds 606 (i.e., bonds 606A and 606B) may remain unattached after the bonding process and act as input/output pads for connecting MEMS device 800 to external circuits (not shown). Cavity 704, opening 706, and bumps 710A are aligned MEMS structure 614 (i.e., part of a pressure sensor), MEMS structure 616 (i.e., part of a microphone), and MEMS structure 618 (i.e., part of another device) respectively.

MEMS structure 618 is disposed in sealed cavities defined by the eutectic bonding. That is, in a top-down view of portions of MEMS device 800 (not shown), at least a portion of the eutectic bonds formed between bonds 606 and 702 form closed loops, sealing MEMS structure 618 in an enclosed cavity. However, certain other bonds 606 and 702 may not form closed loops and be included for electrical connections.

FIG. 2E illustrates completed MEMS device 800 having a pressure sensor 802, a microphone 804, and another device 806. Pressure sensor 802 includes a polysilicon membrane (portion 604A of polysilicon layer 604), which is exposed to ambient pressure on one surface (i.e., through opening 610) and sealed pressure on the other (i.e., through cavity 704). Cavity 704 acts as a sealed pressure chamber defined, for example, by the eutectic bonding process of MEMS wafer 600 to cap wafer 700. Microphone 804 includes moving elements 616 and membrane 604B, which are exposed to an ambient environment through openings 706 and 612. MEMS structures 614 and 616 may function as bottom electrodes for pressure sensor 802 and microphone 804 respectively.

Device 806 may be a motion sensor that allows for the detection of motion through the disposition of a proof mass (i.e., MEMS structure 614) over an electrode (i.e., portions of polysilicon layer 604) in a sealed cavity 708 having pressure defined by eutectic bonding. Alternatively, device 806 may be an accelerometer, a gyroscope, or the like. The pressure of sealed cavity 708 may be selected in accordance with the desired functionality of device 806. For example, sealed cavity 708 may have a pressure between about 100-700 mbar for an accelerometer, between about $10^{-4}$ mbar to about 10 mbar for a gyroscope, or the like. Thus, FIGS. 2A-2E illustrate an alternative embodiment of integrating the manufacture of a pressure sensor, microphone, and another MEMS device into the same process.

FIGS. 3A-3I illustrate cross-sectional views of various intermediate stages of manufacture of a MEMS device 1200 in accordance with other alternative embodiments.

Figure 3A:
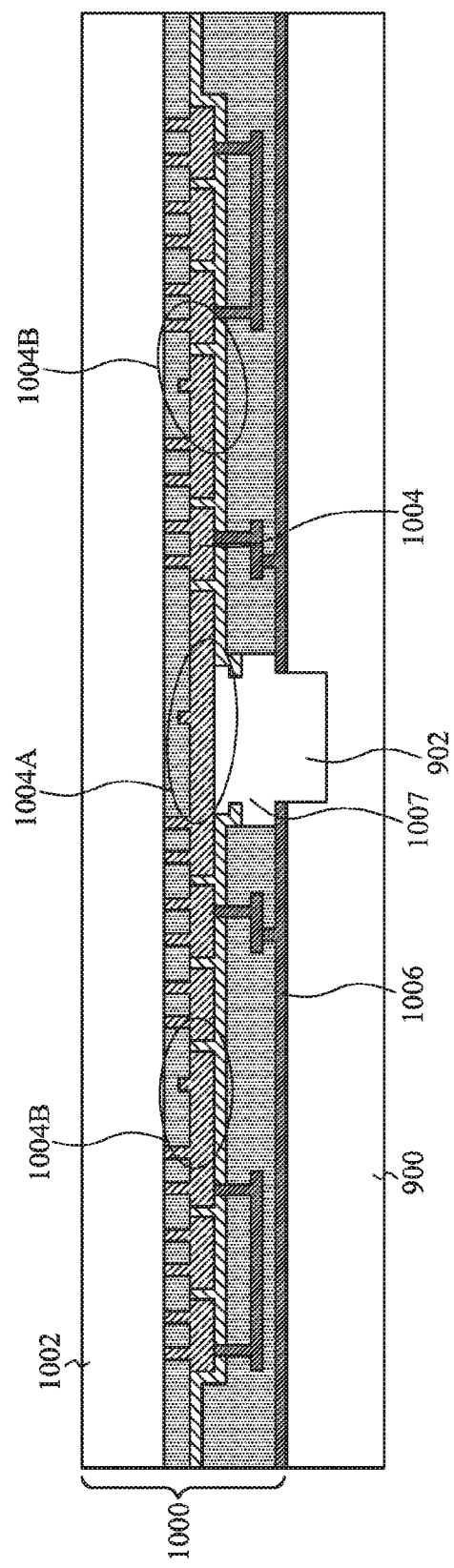

In FIG. 3A, a cross-sectional view of a MEMS wafer 1000 bonded to a carrier wafer 900. MEMS wafer 1000 and carrier wafer 900 may be substantially similar to MEMS wafers 100 and carrier wafer 200 of MEMS device 400. In particular MEMs wafer 1000 includes a substrate 1002, patterned polysilicon layer 1004, bonding layer 1006, and cavity 1007. Cavity 1007 is aligned to a portion 1004A of polysilicon layer 1004. Carrier wafer 900 includes cavity 902. Therefore, detailed description of MEMS wafer 1000 and carrier wafer 900 are omitted for brevity. However, polysilicon layer 1004 may be patterned differently than polysilicon layer 112 of MEMS wafer 100. Notably, portion 1004A of polysilicon layer 1004 is patterned in accordance with a pressure sensor membrane, and portions 1004B are patterned in accordance with other devices (e.g., a motion sensor, gyroscope, accelerometer, and the like). Unlike polysilicon layer 112 of MEMS wafer 100, polysilicon layer 1004 may not include a portion patterned for a microphone membrane.

MEMS wafer 1000 may be bonded to carrier wafer 900 using known bonding processes such as fusion bonding with a bonding layer 1006, which may be a thin polysilicon layer. As a result of the bonding process, cavities 1007 and 902 are aligned.

Figure 3B:
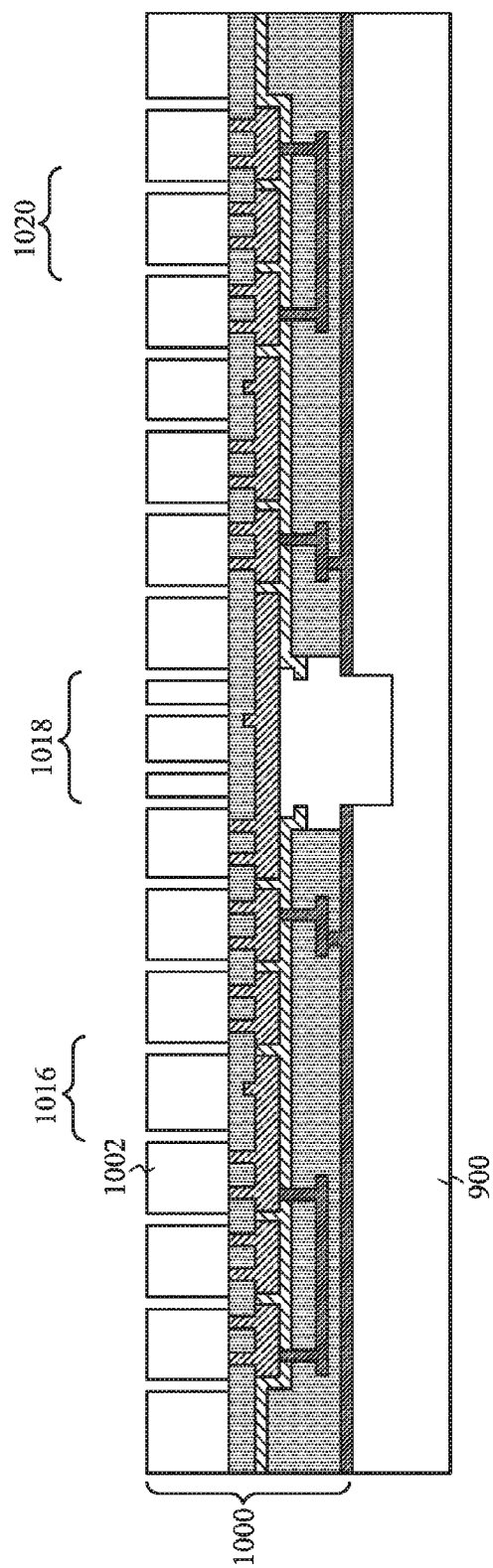

In FIG. 3B, portions of a substrate 1002 in MEMS wafer 1000 has been patterned. The remaining portions of patterned substrate 1002 may form MEMS structures such as structures 1016, 1018, and 1020.

Figure 3C:
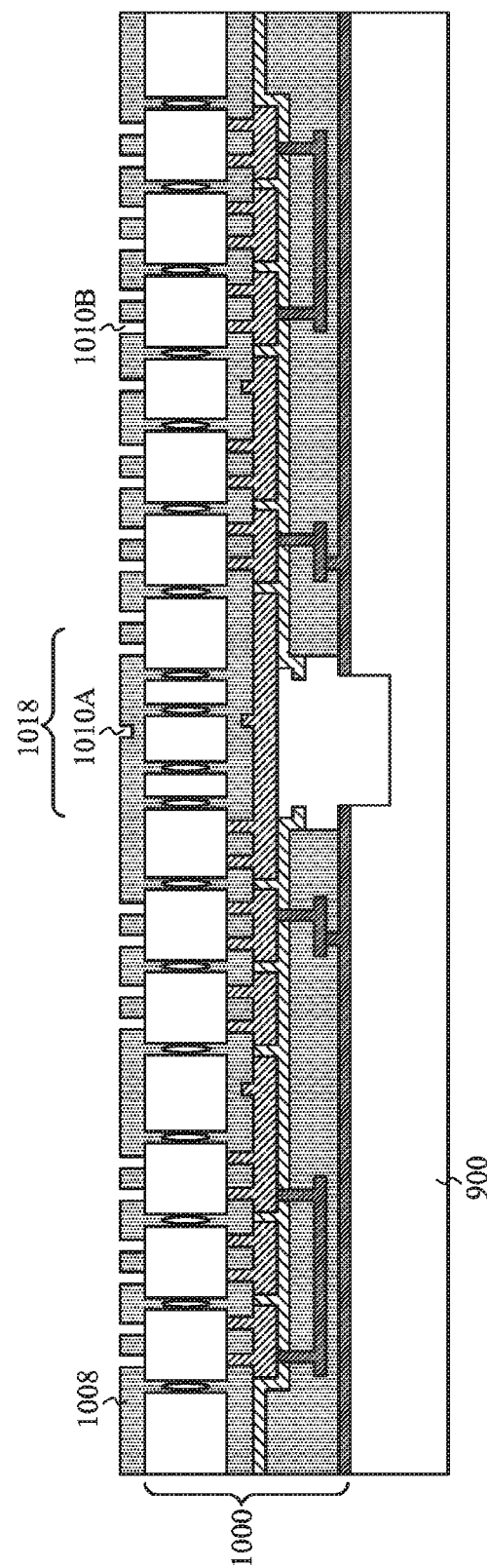

In FIG. 3C, a dielectric layer 1008 may be formed and patterned over substrate 1002. Dielectric layer 1008 may also be referred to as oxide release layer 1008 or sacrificial oxide layer 1008. Oxide release layer 1008 may be formed of a low-k dielectric material, such as silicon dioxide ($SiO_2$). Oxide release layer 1008 may be deposited over substrate 1002 using, for example CVD. Furthermore, oxide release layer 1008 may be formed of a different suitable material such as low-k dielectrics such as carbon doped oxides, extremely low-k dielectrics such as porous carbon doped silicon dioxide or the like. It should be noted that oxide release layer 1008 may be formed through multiple oxide deposition processes and their corresponding etch-back processes. Voids may be embedded in oxide release layer 1008 to alter oxide release time during a subsequent selective oxide etching process (e.g., vapor HF).

Oxide release layer 1008 is patterned, creating bump opening 1010A and via openings 1010B. The patterning of oxide release layer 1008 may be done using, for example, a combination of photolithography and etching techniques. Two separate photolithography steps may be performed in order to create bump opening 1010A and via openings 1010B. For example, a shallow etching may be performed to create bump opening 1010A, while a deeper etching may be performed to create via openings 1010B. As shown in FIG. 3C, bump opening 1010A does not extend to substrate 1002 while via openings 1010B do extend to and expose portions of substrate 1002. Furthermore, bump opening 1010A may be aligned with MEMS structure 1018.

Figure 3D:
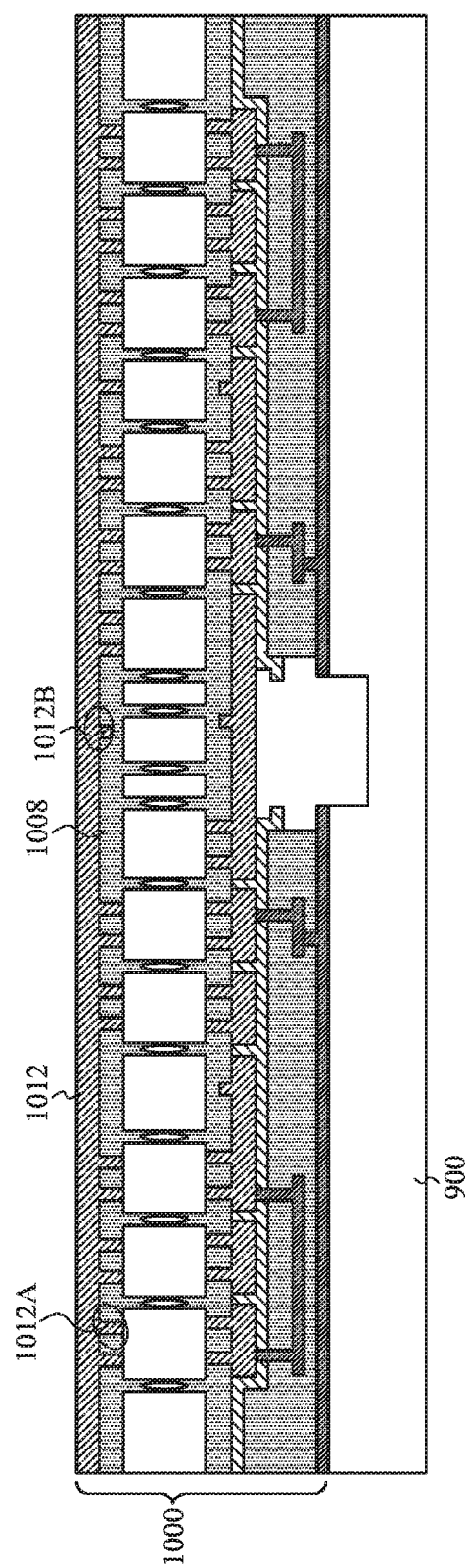

In FIG. 3D, a polysilicon layer 1012 is deposited over oxide release layer 1008 using, for example, CVD. Polysilicon layer 1012 fills via openings 1010B and bump opening 1010A, forming polysilicon vias 1012A and polysilicon bump 1012B respectively. Polysilicon layer 1012 may be substantially similar to polysilicon layer 1004. Polysilicon vias 1012A may be formed for electrical routing and may further act as a mechanical structure. For example polysilicon vias 1012A may be used as a vapor HF etch stop layer in subsequent process steps. Furthermore, in some embodiments, polysilicon bump 1012B may be used as an electrical bump, a mechanical bump to limit the motion of moving elements, or an anti-stiction bump.

Figure 3E:
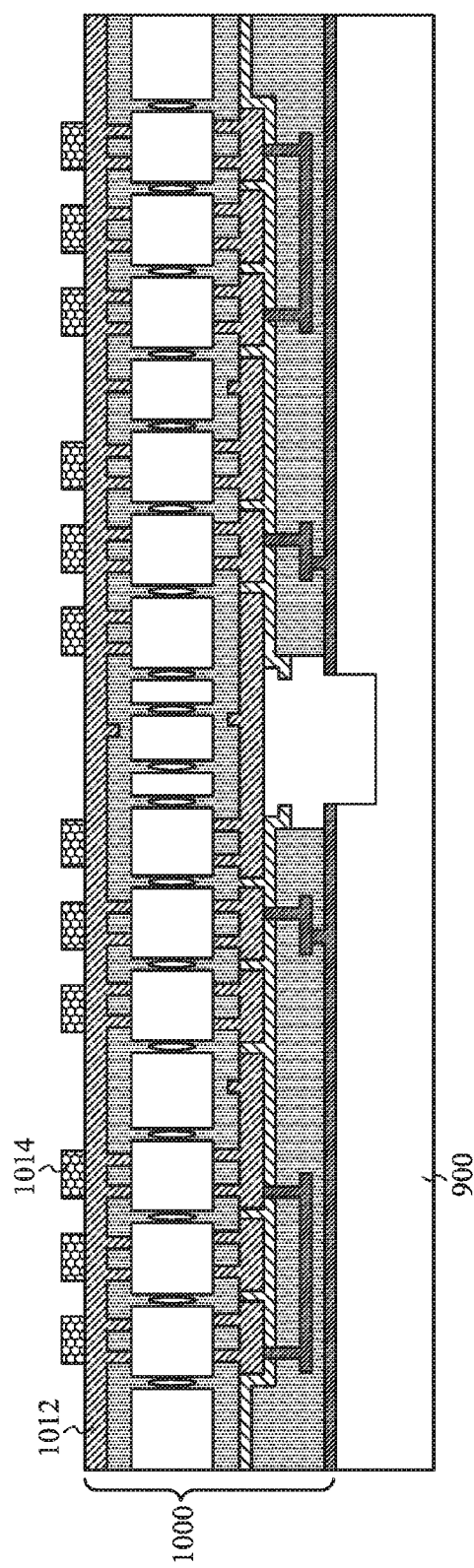

In FIG. 3E, metal bonds 1014 are formed over polysilicon layer 1012. Bonds 1014 may be substantially similar to bonds 204 in MEMS device 400. Therefore, detailed descriptions of these features are omitted for brevity. In FIG. 3F, polysilicon layer 1012 is patterned to expose portions of oxide release layer 1008. Furthermore, a portion of polysilicon layer 1012 corresponding to MEMS structure 1018 (i.e., portion 1012C) may be patterned in accordance with a membrane of a microphone device.

Figure 3G:
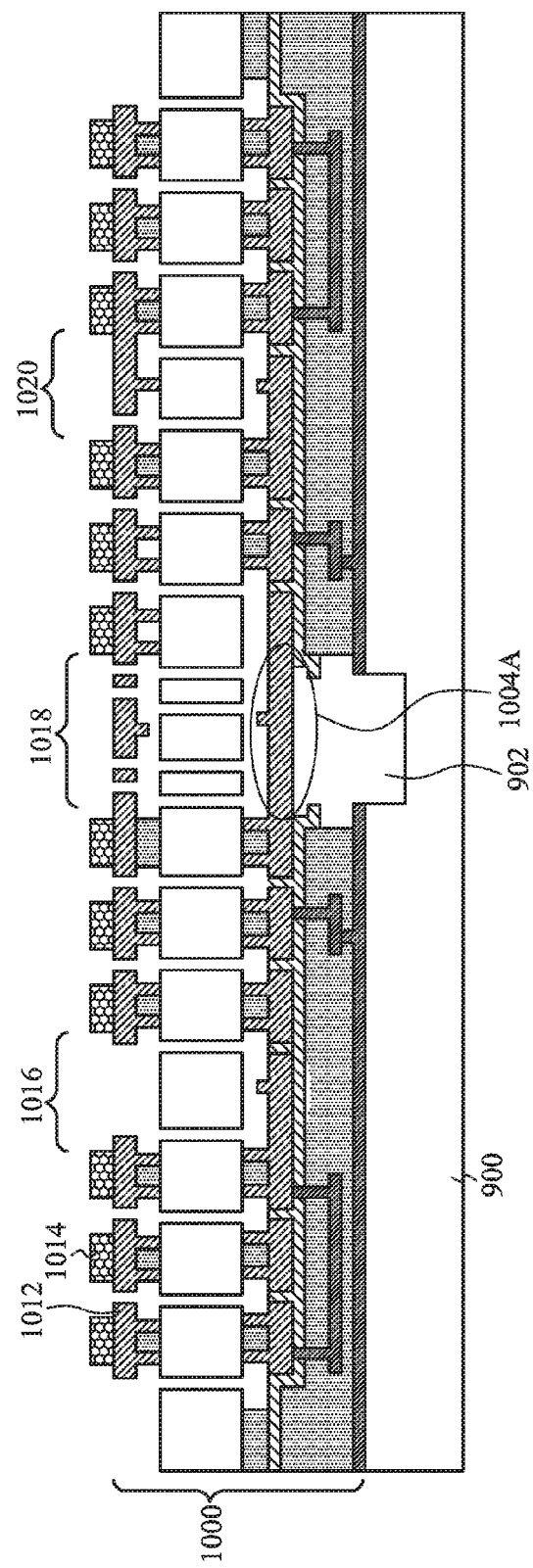

FIG. 3G illustrates the release of the MEMS structures 1016, 1018, and 1020 by a vapor HF etching of portions of oxide release layers 1008 and various oxide release layers in MEMS wafer 1000. This type of etch process has a high selectivity between oxide release layers and other features in MEMS wafer 1000 so that that the other features are not significantly attacked during the removal of portions of the various oxide release layers. Furthermore, polysilicon layers 1004 and 1012 protects portions of oxide release layers during the etch process, and these protected regions may be referred to as anchor regions. This etch process allows for free movement of the movable elements of MEMS structures 1016 and 1020 in at least one axis. Furthermore, MEMS structure 1018 may be designed to be stiff and having a relatively limited range of motion even after the vapor HF process. It should be noted that the oxide release layers to be removed depend on layout design.

Figure 3H:
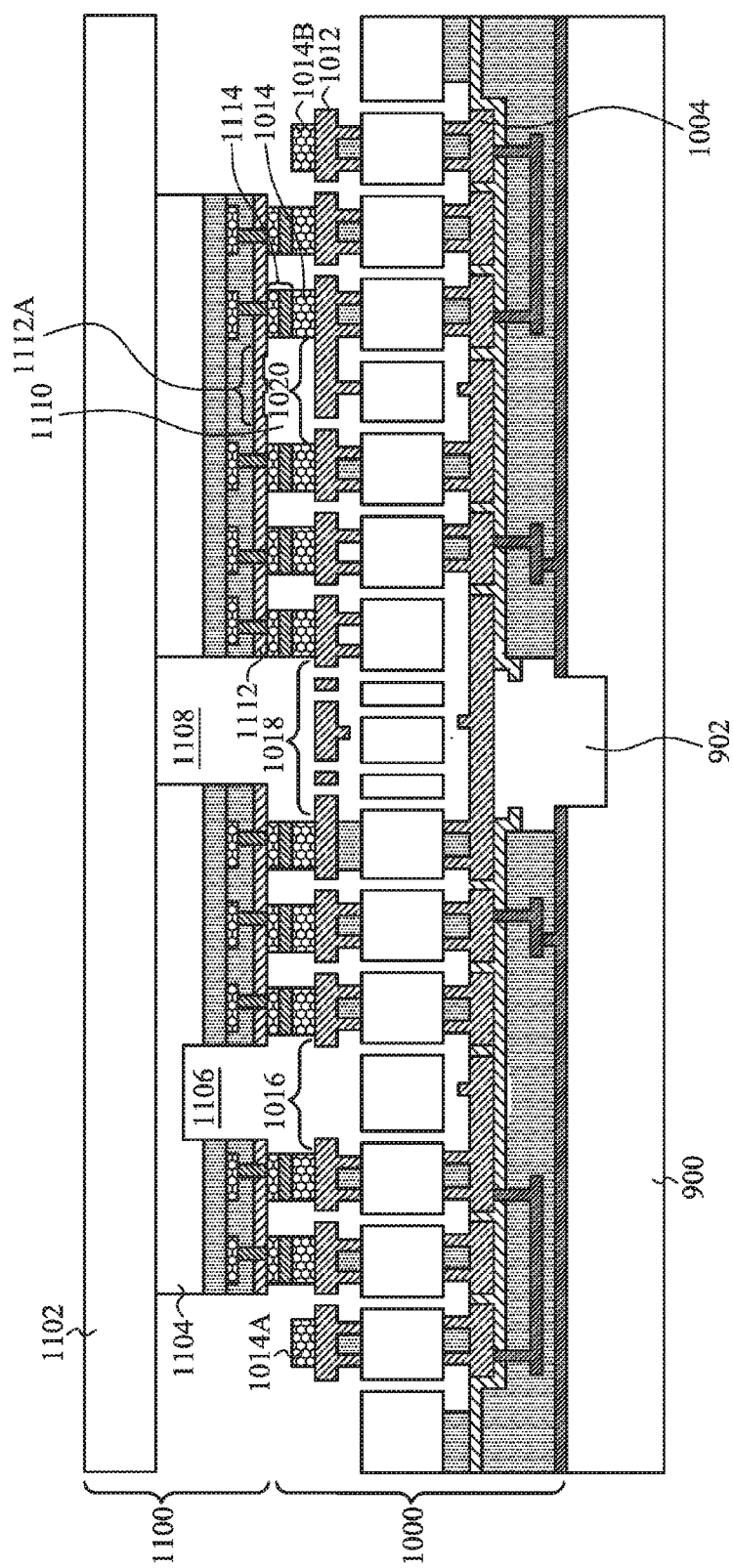

In FIG. 3H, MEMS wafer 1000 is bonded to a cap wafer 1100. Cap wafer 1100 may be substantially similar to cap wafer 300 of MEMS device 400. That is, cap wafer 1100 includes a temporary handle wafer 1102, a substrate 1104, cavities 1106 and 1108, bumps 1112A in a film layer 1112, and bonds 1114. Therefore, detailed description of cap wafer 1100 is omitted for brevity. However, it should be noted that while cavity 1108 fully extends through substrate 1104, cavity 1106 only partially extends through substrate 1104.

MEMS wafer 1000 may be bonded to cap wafer 1100 using an appropriate bonding process, for example eutectic bonding of bonds 1114 and 1014. Furthermore, after the bonding process, certain bonds 1014 (e.g., 1014A and 1014B) may remain unattached to bonds 1114. These unattached bonds 1014A and 1014B may be used as input/output pads for connecting MEMS device 1200 to external circuits. MEMS structures 1016, 1018, and 1020 may be aligned with cavity 1106, cavity 1108, and bumps 1112A respectively. MEMS structures 1016 and 1020 may be disposed in sealed cavities 1106 and 1110 defined by the eutectic bonding process. That is, in a top-down view of portions of MEMS device 1200 (not shown), at least a portion of the eutectic bonds formed between bonds 1014 and 1114 form closed loops, sealing MEMS structures 1016 and 1020 in an enclosed cavities.

Figure 3I:
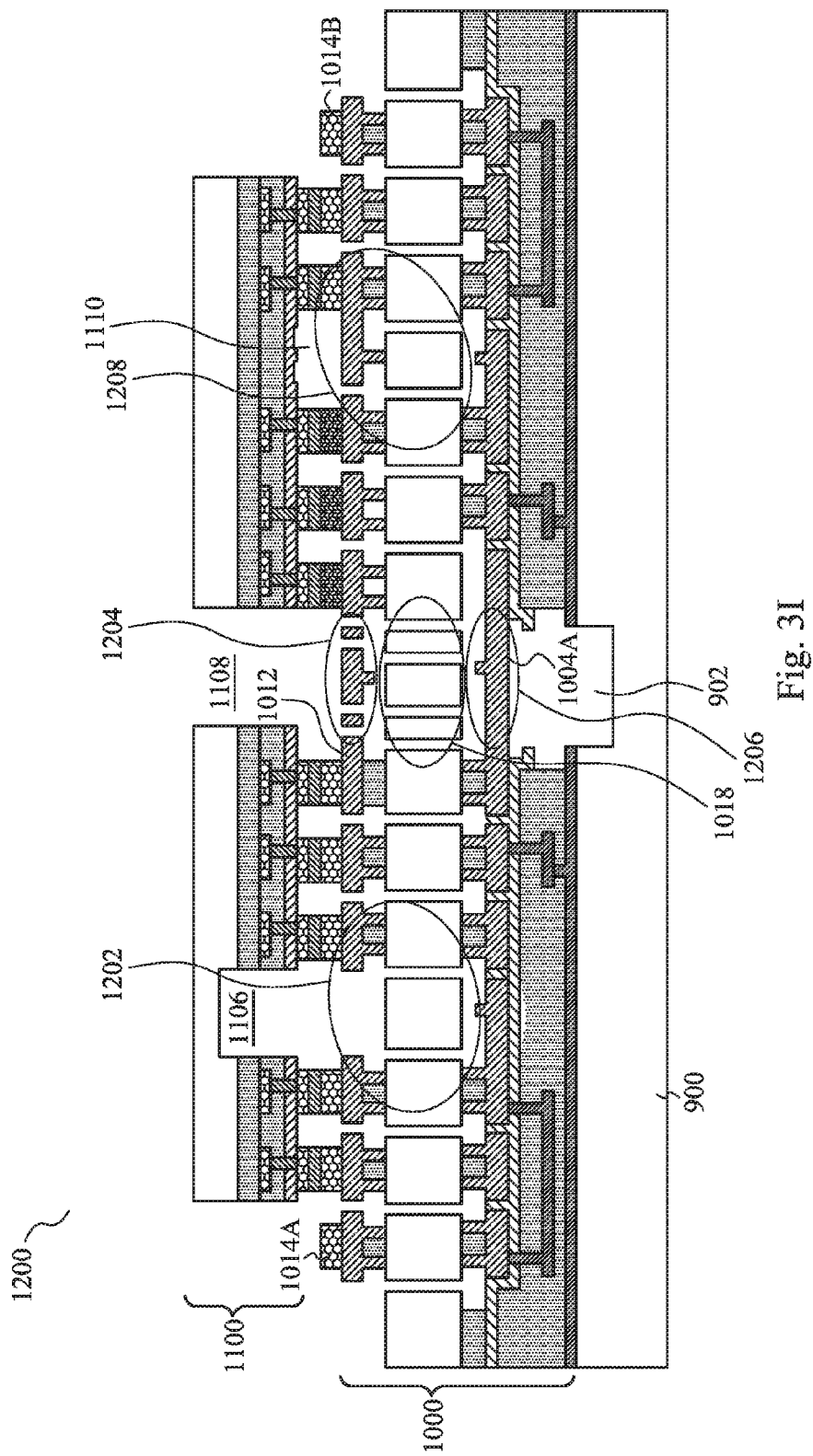

FIG. 3I shows the removal of temporary handle wafer 1102, exposing cavity 1108 and bonds 1014A and 1014B. Thus, MEMS device 1200 is completed. MEMS device 1200 includes devices 1202 and 1208, pressure sensor 1206, and microphone 1204. Notably, pressure sensor 1206 and microphone 1204 are disposed on opposite sides of the same MEMS structure 1018.

Devices 1202 and 1208 may be motion sensors, gyroscopes, accelerometers, or the like. A pressure level of sealed cavities 1106 and 1110 may be selected in accordance with a desired functionality of device 1202 and/or 1208. Furthermore, the pressure level of cavities 1106 and 1110 may be different and adjusted, for example, by selecting an appropriate volume of the respective cavity based on physical laws (e.g., the ideal gas law). Devices 1202 and 1208 may or may not perform the same function.

Pressure sensor 1206 includes a membrane of a portion 1004A of polysilicon layer 1004, which is exposed to ambient pressure on one side (via cavity 1108) and sealed pressure on the other (via cavity 902). The pressure of cavity 902 may be defined by the fusion bonding process of MEMS wafer 1100 to carrier wafer 900. Microphone 1204 includes a membrane of a portion of polysilicon layer 1012, which is exposed to an ambient environment through cavity 1108. Thus FIGS. 3A-3I disclose various intermediate stages of manufacture for incorporating the manufacture of MEMS devices, a MEMS pressure sensor device, and a MEMS microphone device in the same process.

In an embodiment, a MEMS device is provided. The MEMS device includes a MEMS wafer including a membrane layer comprising a first membrane for a microphone device and a second membrane for a pressure sensor device, and a MEMS structure. The MEMS device also includes a carrier wafer bonded to the MEMS wafer, the carrier wafer comprising first and second cavities exposed to an ambient environment, wherein the first cavity includes the first membrane, and wherein the second cavity includes a first surface of the second membrane, and a cap wafer bonded to a surface of the MEMS wafer opposing the carrier wafer, wherein the cap wafer and the MEMS wafer define third and fourth sealed cavities, and wherein the MEMS structure is disposed in the third sealed cavity and a second surface of the second membrane is exposed to a sealed pressure level of the fourth cavity.

In another embodiment, a MEMS device is provided. The MEMS device includes a MEMS substrate having a membrane layer on a first side, the membrane layer comprising a first membrane disposed over a first opening in the MEMS substrate and a second membrane disposed over a second opening in the MEMS substrate, the first opening and the second opening extending from the first side to a second side of the MEMS substrate, the MEMS substrate having a MEMS structure region, the MEMS structure region comprising a flexible structure. A carrier substrate is bonded to the MEMS substrate, the carrier substrate having a first cavity exposing the first membrane and a second cavity exposing the second membrane, and a cap substrate is bonded to the MEMS substrate, the MEMS substrate being interposed between the carrier substrate and the cap substrate, the cap substrate having a third cavity exposed to the first opening and a fourth cavity exposed to the second opening, wherein the first membrane, the first cavity, and the third cavity form a pressure sensor, and wherein the second membrane, the second cavity, and the fourth cavity form a microphone.

In yet another embodiment, a MEMS device is provided. The MEMS device includes a MEMS substrate having a first opening, a second opening, and a third opening extending from a first side to a second side of the MEMS substrate, the MEMS substrate having a first membrane extending over the first opening, a second membrane extending over the second opening and a third membrane extending over the third opening. A carrier substrate bonded to MEMS substrate, and a cap substrate is bonded to the MEMS substrate, wherein a first surface of the first membrane covers a first sealed cavity and a second surface of the first membrane is exposed to ambient, wherein the carrier substrate and the cap substrate have openings exposing opposing sides of the second membrane to ambient, and wherein the third membrane seals a cap cavity formed in the cap substrate.

Although the present embodiments and their advantages have been described in detail, it should be understood that various changes, substitutions and alterations can be made herein without departing from the spirit and scope of the disclosure as defined by the appended claims. For example, many of the features and functions discussed above can be implemented in software, hardware, or firmware, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A micro-electromechanical systems (MEMS) device comprising:
    a MEMS substrate having a first opening, a second opening, and a membrane layer, the membrane layer comprising a first membrane disposed over the first opening of the MEMS substrate and a second membrane disposed over the second opening of the MEMS substrate;
    a carrier substrate bonded to a first side of the MEMS substrate, the carrier substrate having a first cavity exposing the first membrane and a second cavity exposing the second membrane; and
    a cap substrate bonded to a second side of the MEMS substrate opposing the first side of the MEMS substrate, the cap substrate having a third cavity connected to the first opening and a fourth cavity connected to the second opening, wherein the first membrane, the first cavity, and the third cavity are part of a pressure sensor, wherein the fourth cavity extends completely through the cap substrate, and wherein the second membrane, the second cavity, and the fourth cavity are part of a microphone.

2. The MEMS device of claim 1, wherein the membrane layer comprises polysilicon.

3. The MEMS device of claim 1, wherein the second opening comprises a plurality of openings.

4. The MEMS device of claim 1, wherein the first cavity extends through the carrier substrate and exposes a first side of the first membrane to the ambient.

5. The MEMS device of claim 4, wherein the third cavity extends partially into the cap substrate, wherein a second side of the first membrane opposite the first side covers the third cavity, and wherein the third cavity is a sealed cavity.

6. The MEMS device of claim 5, wherein a pressure of the sealed cavity is different from a pressure of the ambient.

7. The MEMS device of claim 1, wherein the third cavity extends through the cap substrate and exposes a first side of the first membrane to the ambient.

8. The MEMS device of claim 7, wherein the first cavity extends partially into the carrier substrate, wherein a second side of the first membrane opposite the first side covers the first cavity, and wherein a sealed cavity comprises the first cavity covered by the first membrane.

9. The MEMS device of claim 1, wherein the MEMS substrate further has a third opening enclosed in a fifth cavity between the carrier substrate and the cap substrate, wherein the fifth cavity is a sealed cavity.

10. The MEMS device of claim 9, wherein the membrane layer further comprises a third membrane over the third opening, wherein a first side of the third membrane is exposed to a pressure of the fifth cavity.

11. A micro-electromechanical systems (MEMS) device comprising:
    a MEMS substrate having a first opening, a second opening, and a third opening, the MEMS substrate having a first membrane extending over the first opening, a second membrane extending over the second opening and a third membrane extending over the third opening;
    a carrier substrate bonded to MEMS substrate, the carrier substrate having a first cavity and a second cavity, the first cavity exposing the first membrane, the second cavity extending through the carrier substrate and exposing the second membrane; and
    a cap substrate bonded to the MEMS substrate, the cap substrate having a third cavity, a fourth cavity and a fifth cavity, the third cavity exposing the first membrane, the fourth cavity extending through the cap substrate and exposing the second membrane, and the fifth cavity exposing the third membrane, wherein a first surface of the first membrane covers a first one of the first cavity and the third cavity to form a first sealed cavity, a second surface of the first membrane is exposed to ambient, wherein opposing sides of the second membrane are exposed to ambient, and wherein the third membrane covers the fifth cavity to form a second sealed cavity.

12. The MEMS device of claim 11, wherein the first sealed cavity comprises the first cavity covered by the first membrane.

13. The MEMS device of claim 11, wherein the first sealed cavity comprises the third cavity covered by the first membrane.

14. The MEMS device of claim 11, wherein the third membrane and the third opening of the MEMS substrate are part of a motion sensor, wherein the third membrane acts as the bottom electrode of the motion sensor.

15. The MEMS device of claim 11, wherein at least one of the first membrane, the second membrane, and the third membrane has a bump protruding above an adjacent surface area of a respective membrane.

16. A micro-electromechanical systems (MEMS) device comprising:
 a MEMS substrate comprising:
  a first layer;
  a first opening extending through the first layer;
  a first membrane on a first side of the first layer; and
  a second membrane on a second side of the first layer opposing the first side of the first layer;
 a carrier substrate bonded to a first side of the MEMS substrate, the carrier substrate having a first cavity that extends partially into the carrier substrate, wherein the first membrane covers the first cavity, wherein a first sealed cavity comprises the first cavity covered by the first membrane; and
 a cap substrate bonded to a second side the MEMS substrate, the cap substrate having a second cavity that extends through the cap substrate, wherein opposing sides of the second membrane are exposed to ambient through the second cavity.

17. The MEMS device of claim 16, wherein the first membrane and the second membrane are between the first sealed cavity and the second cavity.

18. The MEMS device of claim 16, wherein the MEMS substrate further comprises:
 a second opening extending through the first layer; and
 a third membrane on the first side of the first layer and over the second opening,
 wherein the second opening is connected to a third cavity extending partially into the cap substrate, wherein the third membrane covers the second opening and the third cavity, wherein a second sealed cavity comprises the second opening and the third cavity covered by the third membrane.

19. The MEMS device of claim 18, wherein the MEMS substrate further comprises:
 a third opening extending through the first layer; and
 a fourth membrane on the first side of the first layer and over the third opening; and
 a fifth membrane on the second side of the first layer, the third opening being between the fourth membrane and the fifth membrane,
 wherein the third opening is enclosed in a third sealed cavity between the cap substrate and the carrier substrate.

20. The MEMS device of claim 19, wherein a pressure in the second sealed cavity is different from a pressure in the third sealed cavity.

\* \* \* \* \*